(12) United States Patent
Hirai et al.

(10) Patent No.: US 8,313,177 B2
(45) Date of Patent: Nov. 20, 2012

(54) ACTUATOR, LIQUID DROPLET EJECTING HEAD, AND MANUFACTURING METHOD THEREOF, AND LIQUID DROPLET EJECTING APPARATUS

(75) Inventors: Eiju Hirai, Minamiminowa-mura (JP); Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 106 days.

(21) Appl. No.: 13/024,023

(22) Filed: Feb. 9, 2011

(65) Prior Publication Data

US 2011/0193916 A1 Aug. 11, 2011

(30) Foreign Application Priority Data

Feb. 10, 2010 (JP) ................................. 2010-027318

(51) Int. Cl.
*B41J 2/045* (2006.01)
*H01L 41/22* (2006.01)
*H04R 17/00* (2006.01)
*B21D 53/00* (2006.01)

(52) U.S. Cl. ...................... 347/71; 29/25.35; 29/890.01

(58) Field of Classification Search .................... 347/68, 347/70–72
See application file for complete search history.

(56) References Cited

U.S. PATENT DOCUMENTS

| | | | |
|---|---|---|---|
| 6,336,717 B1 * | 1/2002 | Shimada et al. | 347/71 |
| 2009/0284568 A1 | 11/2009 | Yazaki | |
| 2010/0073435 A1 * | 3/2010 | Miyazawa et al. | 347/71 |

FOREIGN PATENT DOCUMENTS

JP 2009-172878 8/2009

* cited by examiner

*Primary Examiner* — Matthew Luu
*Assistant Examiner* — Lisa M Solomon
(74) *Attorney, Agent, or Firm* — Workman Nydegger

(57) ABSTRACT

An actuator that includes a substrate; first conductive layers provided so as to extend in a first direction and to be disposed adjacent to each other on the substrate; a piezoelectric body layer having a first portion formed so as to cover the first conductive layers and openings between the first conductive layers, a second portion other than the first portions, and a contact to the first conductive layer; a second conductive layer having a third portion which overlap with the first conductive layers in the second direction, a fourth portion connected to the third portion being formed over the second portion of the piezoelectric body layer, and a fifth portion connected to the first conductive layer in the contact; and a wiring having a sixth portion which is formed over the fourth portion of the second conductive layer and a seventh portion connected to the fifth portion.

20 Claims, 13 Drawing Sheets

ACTUATOR, LIQUID DROPLET EJECTING HEAD, AND MANUFACTURING METHOD THEREOF, AND LIQUID DROPLET EJECTING APPARATUS

This application claims a priority to Japanese Patent Application No. 2010-027318 filed on Feb. 10, 2010 which is hereby expressly incorporated by reference herein in its entirety.

BACKGROUND

1. Technical Field

The present invention relates to an actuator, a liquid droplet ejecting head, a method of manufacturing the actuator and the liquid droplet ejecting head, and a liquid droplet ejecting apparatus.

2. Related Art

In a liquid droplet ejecting apparatus such as an ink jet printer which can be used, for example, in an image recording apparatus, a display manufacturing apparatus, or the like, it is known that an actuator having a piezoelectric device is used in a liquid droplet ejecting head for ejecting liquid droplets such as ink. In such an actuator, volume in a pressure chamber can be changed, for example, by deforming a substrate such as a vibration plate, which is formed below the piezoelectric device, by deforming a piezoelectric body of the piezoelectric device by application of a voltage such as a driving signal. Accordingly, the liquid droplet ejecting head can eject liquid droplets, such as ink supplied into the pressure chamber, from a nozzle orifice.

In such an actuator, a common upper electrode structure is known in which a plurality of piezoelectric bodies of the piezoelectric device is formed and an electrode (hereinafter also referred to as an "upper electrode") which covers the piezoelectric bodies is formed so as to continuously cover the plurality of piezoelectric bodies (JP-A-2009-172878). In an actuator having the common upper electrode structure, compared to an electrode (hereinafter also referred to as a "lower electrode") which is covered by the piezoelectric body, the upper electrode needs to function as an electrode common to a plurality of piezoelectric devices and there is a need for a larger current to flow through a lead wiring thereof than in a lead wiring of the lower electrode. Therefore, the lead wiring of the upper electrode requires high reliability.

SUMMARY

An advantage of a first aspect of the invention is that it provides an actuator having high reliability.

An advantage of a second aspect of the invention is that it provides a liquid droplet ejecting head having the above-mentioned actuator.

An advantage of a third aspect of the invention is that it provides a liquid droplet ejecting apparatus having the above-mentioned liquid droplet ejecting head.

An advantage of a fourth aspect of the invention is that it provides a method of manufacturing an actuator having high reliability.

An advantage of a fifth aspect of the invention is that it provides a method of manufacturing a liquid droplet ejecting head having the above-mentioned actuator.

According to a first aspect of the invention, there is provided an actuator including: a substrate having a first face; a plurality of first electrically-conductive layers provided so as to extend in a first direction and to be disposed adjacent to each other in a second direction intersecting the first direction in the first face; a piezoelectric body layer having a first portion formed so as to cover at least a portion of each of a plurality of the first electrically-conductive layers, and a second portion other than the first portion; a second electrically-conductive layer having a third portion which extends along the second direction so as to overlap with at least a portion of each of the first electrically-conductive layers when viewed from the direction perpendicular to the first face and continuously cover a plurality of the first portions, and a fourth portion, which is electrically connected to the third portion, is formed over the second portion of the piezoelectric body layer and extends in the first direction; a first lead wiring having a fifth portion which is formed over the fourth portion of the second electrically-conductive layer and extends in the first direction; and a protective film formed so as to cover at least a portion of the first lead wiring, wherein the piezoelectric body layer has a plurality of first opening portions provided so as to extend in the first direction and to be disposed adjacent to each other in the second direction, and the first portion of the piezoelectric body layer is a portion sandwiched between the first opening portions.

In addition, in a description related to an embodiment, the word "over" is used, for example, as meaning that a specific object (hereinafter referred to as an "A") is formed over another specific object (hereinafter referred to as a "B"). In a description related to the invention, in a case such as this example, the word "over" is used as including a case where the A is directly formed on the B and a case where the A is formed on the B with another object interposed therebetween. Similarly, the word "under" is used as including a case where the A is formed directly below the B and a case where the A is formed below the B with another object interposed therebetween.

According to the first aspect of the invention, since the first lead wiring is covered by the protective film, peeling-off of the first lead wiring is prevented. Accordingly, it is possible to provide an actuator having high reliability.

In the first aspect of the invention, the third portion of the second electrically-conductive layer may further cover a portion of the second portion of the piezoelectric body layer, the first lead wiring further may have a sixth portion which is electrically connected to the fifth portion, is formed over the third portion which is over the second portion, and extends in the second direction, and the sixth portion may also be covered by the protective film.

In the first aspect of the invention, the second portion of the piezoelectric body layer may have a second opening portion which exposes a portion of each of the first electrically-conductive layers, a second lead wiring may be formed which is electrically connected to each of the first electrically-conductive layers in the second opening portion, and the protective film may further cover a portion of the second lead wiring.

In the first aspect of the invention, the protective film may have a third opening portion which makes a portion of the third portion be opened, and when the first portions of the piezoelectric body layer sandwiched between the first electrically-conductive layers and the second electrically-conductive layer are set as driving regions and a portion of the third portion which is exposed from the protective film through the third opening portion is set as a seventh portion, both end portions in the first direction of the seventh portion may extend in the second direction and continuously overlap with a plurality of the driving regions when viewed from the direction perpendicular to the first face.

In the first aspect of the invention, a foundation layer composed of an electrical-conducting material may be formed between the first face of the substrate and the second portion of the piezoelectric body layer.

In the first aspect of the invention, the material of the protective film may be composed of at least one of an oxide material, a nitride material, a photosensitive resin material, and an organic-inorganic hybrid material.

According to a second aspect of the invention, there is provided a liquid droplet ejecting head including the actuator according to the first aspect.

According to a third aspect of the invention, there is provided a liquid droplet ejecting apparatus including the liquid droplet ejecting head according to the second aspect.

According to a fourth aspect of the invention, there is provided a method of manufacturing an actuator, including: preparing a substrate having a first face; forming a plurality of first electrically-conductive layers provided so as to extend in a first direction and to be disposed adjacent to each other in a second direction intersecting the first direction in the first face; forming a piezoelectric body layer having a first portion formed so as to cover at least a portion of each of a plurality of the first electrically-conductive layers, and a second portion other than the first portion; forming a second electrically-conductive layer having a third portion which extends along the second direction so as to overlap with at least a portion of each of the first electrically-conductive layers when viewed from the direction perpendicular to the first face and continuously cover a plurality of the first portions, and a fourth portion which is electrically connected to the third portion, is formed over the second portion of the piezoelectric body layer, and extends in the first direction; forming a first lead wiring having a fifth portion which is formed over the fourth portion of the second electrically-conductive layer and extends in the first direction; and forming a protective film formed so as to cover at least a portion of the first lead wiring, wherein the piezoelectric body layer has a plurality of first opening portions provided so as to extend in the first direction and to be disposed adjacent to each other in the second direction, and the first portion of the piezoelectric body layer is a portion sandwiched between the first opening portions.

According to the fourth aspect of the invention, since the first lead wiring is covered by the protective film, peeling-off of the first lead wiring is prevented. Moreover, process damage to the first lead wiring during manufacturing can also be prevented. Accordingly, it is possible to provide a method of manufacturing an actuator having high reliability.

According to a fifth aspect of the invention, there is provided a method of manufacturing a liquid droplet ejecting head, including: forming an actuator by the actuator manufacturing method described above; and forming a flow path forming plate having pressure chambers which respectively overlap with a plurality of the first electrically-conductive layers in a second face on the opposite side to the first face of the substrate.

According to the fifth aspect of the invention, since the first lead wiring is covered by the protective film, peeling-off of the first lead wiring is prevented. Moreover, process damage to the first lead wiring during manufacturing can also be prevented. Accordingly, it is possible to provide a method of manufacturing a liquid droplet ejecting head provided with an actuator having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, one example of an embodiment to which the invention is applied will be described with reference to the drawings. However, the invention is not limited only to the following embodiment. The invention should be construed as including combinations of the following embodiment and modified examples thereof without restriction.

1. Actuator and Liquid Droplet Ejecting Head

Hereinafter, an actuator and a liquid droplet ejecting head, which are related to this embodiment, will be described with reference to the drawings.

Figure 1:
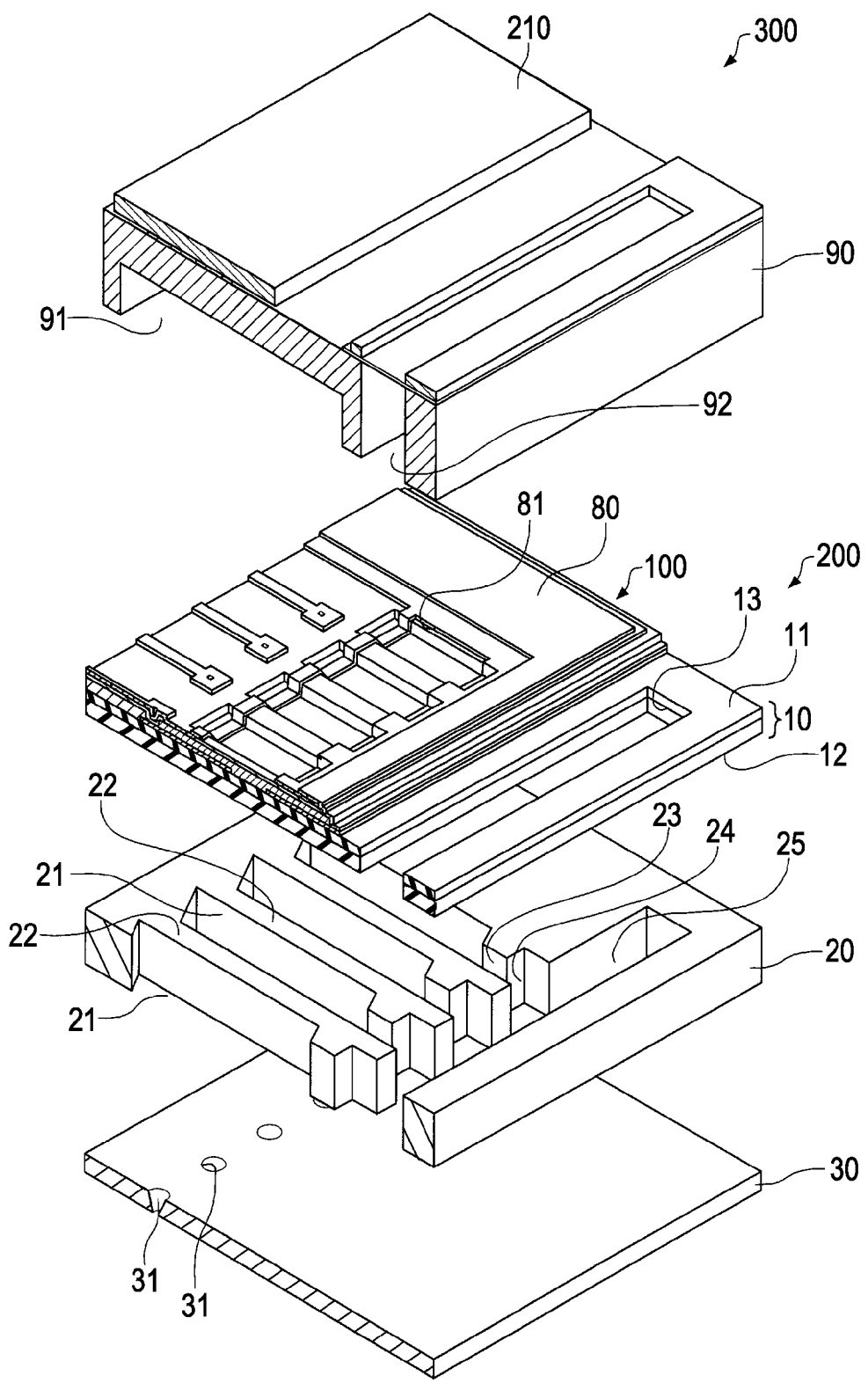
FIG. 1 is an exploded perspective view schematically showing a liquid droplet ejecting head related to an embodiment.

FIG. 1 is an exploded perspective view of a liquid droplet ejecting head 300 related to this embodiment.

As shown in FIG. 1, the liquid droplet ejecting head 300 related to this embodiment includes a flow path forming plate 20 having a pressure chamber 21, a vibration plate 10 formed above the flow path forming plate 20, a piezoelectric device 100 formed above the vibration plate 10, a nozzle plate 30 formed below the flow path forming plate 20, and a sealing plate 90 which seals the piezoelectric device 100.

As shown in FIG. 1, the liquid droplet ejecting head 300 related to this embodiment includes an actuator 200 related to this embodiment. The actuator 200 related to this embodiment is a piezoelectric actuator which includes the piezoelectric device 100, and includes the vibration plate 10.

The vibration plate 10 is a plate-like member and has a first face 11, in which the piezoelectric device 100 is formed above the face, and a second face 12 which is the face opposite to the first face 11. In the actuator 200, the vibration plate 10 constitutes a deformation section. In other words, the vibration plate can be deformed by deformation of the piezoelectric device 100, which will be described later. Accordingly, it is possible to change the volume of the pressure chamber 21 formed below. The structure and the material of the vibration plate 10 are not particularly limited as long as they have elasticity and can be deformed. For example, the vibration plate 10 may be formed by a laminated body of a plurality of films, as shown in FIG. 1. At this time, the vibration plate 10 may also be a laminated body of a plurality of films, which is composed, for example, of an insulating film such as zirconium oxide or silicon oxide, a metal film such as nickel, and a polymeric material film such as polyimide.

Also, as shown in FIG. 1, a through-hole 13 which communicates with a reservoir 25 which will be described later is formed in the vibration plate 10. The shape of the through-hole 13 is not particularly limited as long as it is capable of supplying liquid to the reservoir 25. Although it is not shown in the drawing, a metal layer may be formed on the periphery of an opening portion of the through-hole 13.

The flow path forming plate 20 is formed over the second face 12 of the vibration plate 10, as shown in FIG. 1. In other words, the flow path forming plate 20 is disposed below the vibration plate 10 and so as to face the second face 12, as shown in FIG. 1. The flow path forming plate 20 has the pressure chamber 21, as shown in FIG. 1. An upper face and a bottom face of the pressure chamber 21 are respectively formed by the second face 12 of the vibration plate 10 and the nozzle plate 30 which will be described later. As shown in FIG. 1, the flow path forming plate 20 has wall portions 22 constituting side walls of the pressure chamber 21. Also, the flow path forming plate 20 may have the reservoir 25 which communicates with the pressure chamber 21 through a supply path 23 and a communication path 24. The reservoir 25 communicates with the through-hole 13, so that liquid may be supplied from the outside to the inside of the reservoir 25 through the through-hole 13. By supplying liquid into the reservoir 25, it is possible to supply liquid to the pressure chamber 21 through the supply path 23 and the communication path 24. The shape of the pressure chamber 21 is not particularly limited. With respect to the shape of the pressure chamber 21, for example, the shape in a plan view viewed from the normal direction of the first face 11 (hereinafter also referred to as "in a plan view") may be a parallelogram or may also be a rectangle. The number of pressure chambers 21 is not particularly limited, but may be one or greater. The material of the flow path forming plate 20 is not particularly limited. The flow path forming plate 20 may be formed, for example, of single-crystal silicon, nickel, stainless, stainless steel, glass ceramics, or the like.

The nozzle plate 30 is formed below the flow path forming plate 20 (on the opposite side to the side on which the vibration plate 10 is formed), as shown in FIG. 1. The nozzle plate 30 is a plate-like member and has nozzle orifices 31. The nozzle orifice 31 is formed so as to communicate with the pressure chamber 21. The shape of the nozzle orifice 31 is not particularly limited as long as it is capable of discharging liquid. Liquid in the pressure chamber 21 can be discharged, for example, toward the lower side of the nozzle plate 30 (in a direction from the inside of the pressure chamber 21 to the outside of the nozzle orifice 31) through the nozzle orifice 31. The number of the nozzle orifices 31 is not particularly limited, but may be one. Also, the nozzle orifice 31 may also be provided in a plurality so as to respectively correspond to a plurality of pressure chambers 21, as shown in FIG. 1. The material of the nozzle plate 30 is not particularly limited. The nozzle plate 30 may be formed, for example, of single-crystal silicon, nickel, stainless, stainless steel, glass ceramics, or the like.

The piezoelectric device 100 of the liquid droplet ejecting head 300 related to this embodiment is formed over the first face 11 of the vibration plate 10, as shown in FIG. 1. The actuator 200 related to this embodiment is constituted by the piezoelectric device 100 and the vibration plate 10. Hereinafter, details of the actuator 200 related to this embodiment will be described with reference to FIGS. 2A to 2C.

Figure 2A:
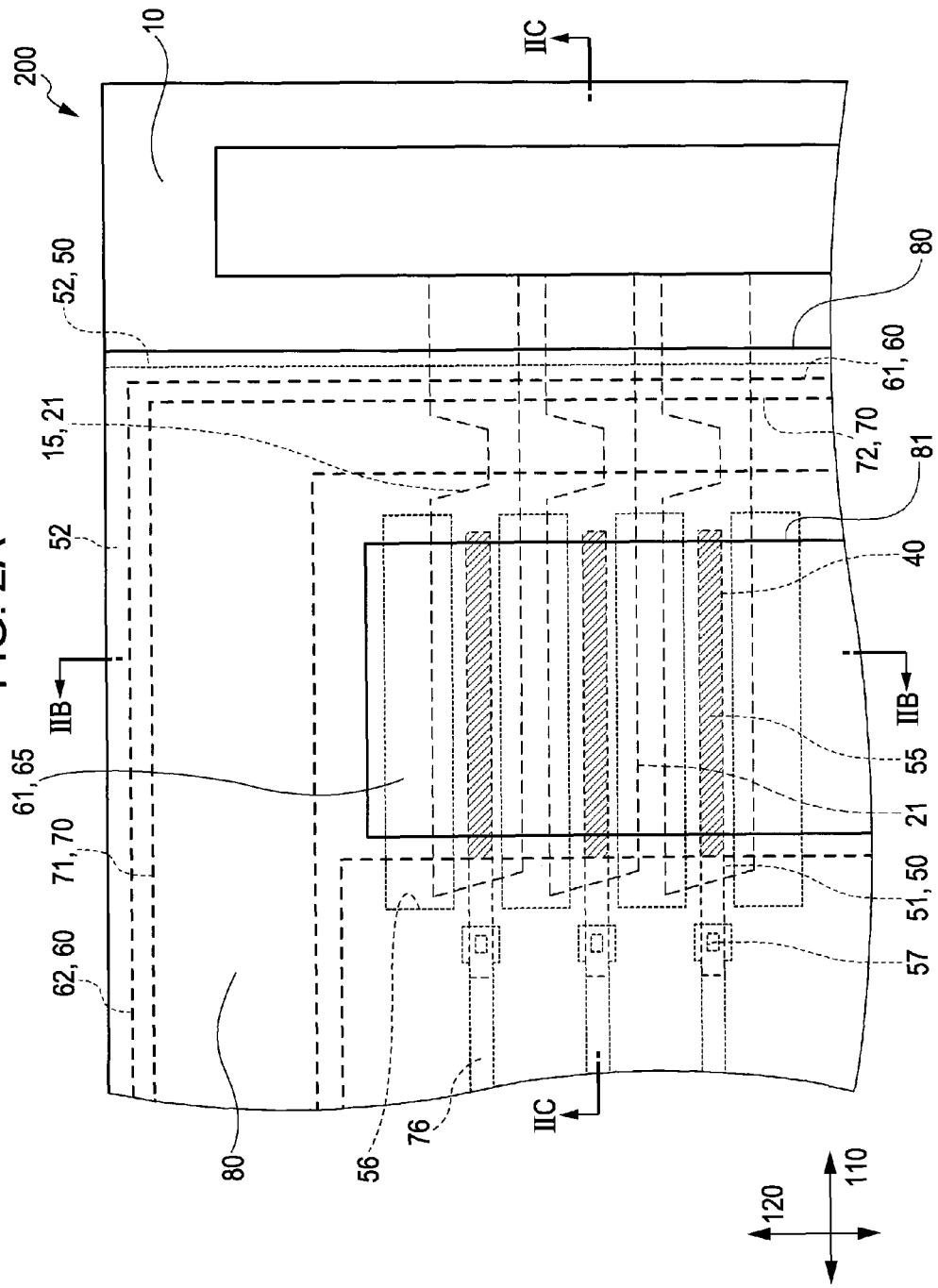
FIG. 2A is a plan view schematically showing principal sections of the liquid droplet ejecting head related to the embodiment.
Figure 2B:
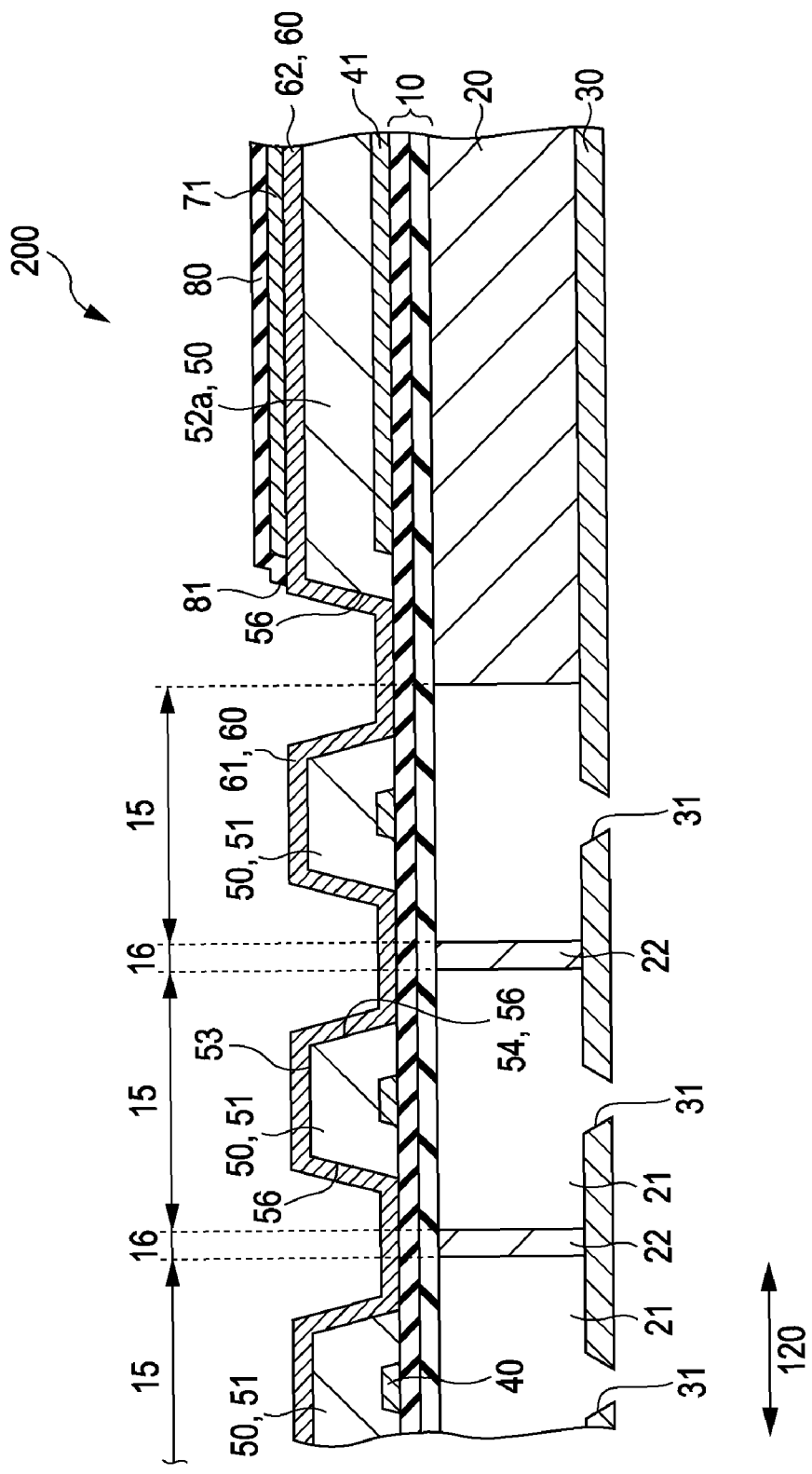
FIG. 2B is a cross-sectional view schematically showing the principal sections in line IIB-IIB of FIG. 2A.
Figure 2C:
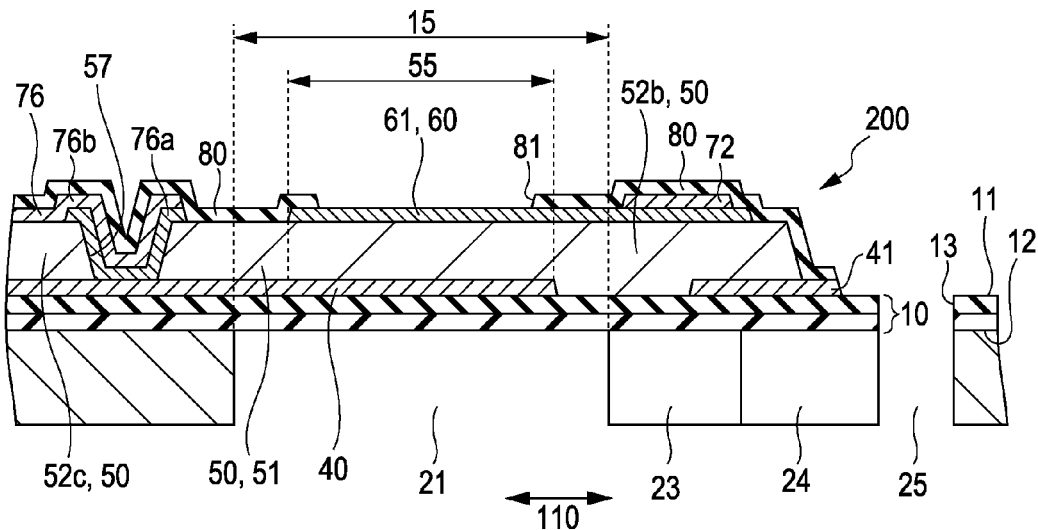
FIG. 2C is a cross-sectional view schematically showing the principal sections in line IIC-IIC of FIG. 2A.
Figure 2D:
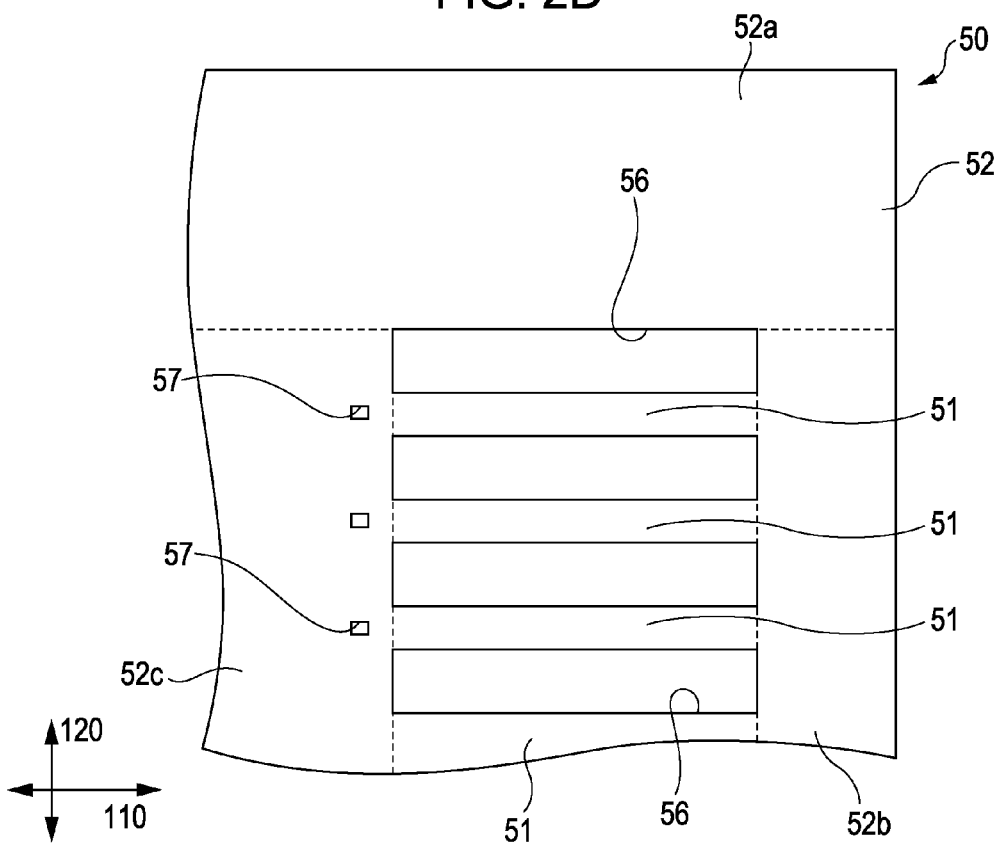
FIG. 2D is a plan view schematically showing a piezoelectric body layer related to the embodiment.

FIG. 2A is a plan view showing only the vibration plate 10, the flow path forming plate 20, and the piezoelectric device 100, which are principal sections of the liquid droplet ejecting head 300, for the sake of convenience. In addition, the plan view of FIG. 2A is a plan view viewed from the direction perpendicular to the first face. FIG. 2B is a cross-sectional view along line IIB-IIB of the principal sections shown in FIG. 2A. FIG. 2C is a cross-sectional view along line IIC-IIC of the principal sections shown in FIG. 2A. FIG. 2D is a plan view schematically showing principal sections of a piezoelectric body layer 50.

Details about a structure of the piezoelectric device 100 will be described below.

As shown in FIGS. 2A to 2C, the piezoelectric device 100 includes a first electrically-conductive layer 40 formed so as to extend in a first direction 110 on the first face 11; the piezoelectric body layer 50 having a first portion 51 formed so as to cover at least a portion of the first electrically-conductive layer 40, and a second portion 52 other than the first portion 51; and a second electrically-conductive layer 60 formed so as to overlap with at least a portion of the first electrically-conductive layer 40 when viewed from the direction perpendicular to the first face 11 and cover at least a portion of the first portion 51 of the piezoelectric body layer 50.

As shown in FIG. 2A, the vibration plate 10 has a movable region 15 in the second face 12 (refer to FIG. 2B). The movable region 15 is a region which overlaps with the pressure chamber 21 of the flow path forming plate 20 formed over the second face 12. As shown in FIG. 2A, the movable region 15 may be formed for each pressure chamber 21. The movable region 15 has the same shape as the shape in a plan view of the pressure chamber 21.

Here, as shown in FIG. 2A, the longitudinal direction of the movable region 15 (the pressure chamber 21), which is one direction in the first face 11, is set as the first direction 110. Also, as shown in FIG. 2A, a direction which intersects the first direction 110 and in which the movable regions 15 (the pressure chambers 21) are disposed adjacent to each other is set as a second direction 120. In a case where the movable regions 15 are disposed so as to be adjacent to each other in the direction perpendicular to the first direction 110, the second direction 120 may be the direction perpendicular to the first direction 110.

As shown in FIG. 2B, in a case where a plurality of movable regions 15 disposed so as to be adjacent to each other in the second direction 120 is formed, a region between the movable regions 15 is set as an immovable region 16. The wall portion 22 of the flow path forming plate 20 is formed below the immovable region 16.

The first electrically-conductive layer 40 is formed so as to extend in the first direction 110 at least in the movable region 15, as shown in FIG. 2A. As shown in FIG. 2A, the first electrically-conductive layer 40 may be formed such that an end portion on one side in the first direction 110 is formed in the movable region 15 and an end portion on the other side is formed outside the movable region 15. However, disposition of both end portions in the first direction 110 of the first electrically-conductive layer 40 is not limited as long as the piezoelectric body layer 50 which is sandwiched between the second electrically-conductive layer 60, which will be described later, and the first electrically-conductive layer 40 is formed in the movable region 15. Also, in a case where a plurality of movable regions 15 is formed on the first face 11, the first electrically-conductive layer 40 may be formed in a plurality and these first electrically-conductive layers may also be formed so as to be disposed adjacent to each other along the second direction 120.

The first electrically-conductive layer 40 is composed of a layer having conductivity and constitutes a lower electrode in the piezoelectric device 100. The structure and the material of the first electrically-conductive layer 40 are not particularly limited as long as they have conductivity. For example, the first electrically-conductive layer 40 may also be formed by a single layer. Or, the first electrically-conductive layer 40 may also be formed by a laminated body of a plurality of films. The first electrically-conductive layer 40 may also be, for example, a metal layer including any of platinum (Pt), iridium (Ir), gold (Au), nickel (Ni), and the like.

Also, although for the sake of convenience, it is omitted in FIG. 2A, as shown in FIGS. 2B and 2C, a foundation layer 41 which is composed of the same material as that of the first electrically-conductive layer 40 may be formed in a region of the first face 11, where the second portion 52 of the piezoelectric body layer 50, which will be described later, is formed. The foundation layer 41 may also be an electrically-conductive film which is formed at the same time when patterning the first electrically-conductive layer 40 after formation of an electrically-conductive film on the first face 11 when forming the first electrically-conductive layer 40. The foundation layer 41 is an electrically-conductive layer to which voltage is not applied and which is formed for controlling crystal growth of a piezoelectric body when forming a piezoelectric body layer on the upper side. Accordingly, crystal orientation of the piezoelectric body layer 50, which will be described later, is made uniform, so that the reliability of the actuator 200 is improved.

The piezoelectric body layer 50 is a plate-like member formed above the first face 11 of the vibration plate 10, as shown in FIGS. 2A and 2D, and has an opening portion 56 which exposes a portion of the vibration plate 10, for example, and divides the first portion 51 and the second portion 52. The first portion 51 is a portion formed so as to cover a portion of the first electrically-conductive layer 40 in the movable region 15, as shown in FIGS. 2A, 2B, and 2D. The second portion 52 is a portion constituting the piezoelectric body layer 50 other than the first portion 51, as shown in FIGS. 2A, 2B, and 2D.

As shown in FIGS. 2A, 2B, and 2D, the piezoelectric body layer 50 has a plurality of opening portions 56. A plurality of opening portions 56 disposed so as to be adjacent to each other along the second direction 120 may be provided. The opening portion 56 extends in the first direction 110 and overlaps with the immovable region 16, and both end portions thereof in the second direction 120 may respectively overlap with adjacent movable regions 15. The shape of the opening portion 56 in a plan view in the normal direction of the first face 11 may be an oblong shape (a rectangle) having long sides extending in the first direction 110. As described above, the piezoelectric body layer 50 sandwiched between adjacent opening portions 56 can be set as the first portion 51. That is, the shape of the opening portion 56 can be appropriately determined according to the shape of the first portion 51 which will be described later.

As shown in FIG. 2A, the first portion 51 is formed so as to extend in the first direction 110 in the movable region 15 and may cover a portion of the first electrically-conductive layer 40. The first portion 51 may also be formed in a plurality so as to respectively cover a plurality of first electrically-conductive layers 40. The first portion 51 may also be formed in a plurality in which the first portions are disposed adjacent to each other along the second direction 120.

The first portion 51 of the piezoelectric body layer 50 may have both ends in the second direction 120 located in the movable region 15, as shown in FIG. 2B. That is, in regard to the second direction 120, the first portion 51 may also have a width larger than the width of the first electrically-conductive layer 40 and narrower than the width of the movable region 15. The first portion 51 may also be formed so as to continuously extend along the first direction 110 and cover the first electrically-conductive layer 40 also at the outside of the movable region 15, as shown in FIG. 2A. However, it is acceptable if the first portion covers the first electrically-conductive layer 40 at least in the movable region 15, and there is no particular limitation. The shape of the first portion 51 is not particularly limited. However, as shown in FIG. 2B, the first portion may also have a face 53 located above the first electrically-conductive layer 40, and tapered side surfaces 54 continued from the face 53. That is, the side surfaces 54 of the first portion 51 may be formed when forming the opening portion 56.

As shown in FIGS. 2A and 2D, the second portion 52 is the piezoelectric body layer 50 other than the first portion 51. As shown in FIG. 2D, the second portion 52 may have a second portion 52a provided so as to be disposed adjacent to a plurality of first portions 51 and opening portions 56 in the second direction 120. Also, as shown in FIGS. 2A and 2D, the second portion 52 may also have a second portion 52b which is provided between an end portion on one side in the first direction 110 of the first portion 51 and the reservoir 25 and the through-hole 13. Also, as shown in FIG. 2D, the second portion 52 may also have a second portion 52c which is provided so as to be disposed adjacent in the first direction 110 to an end portion on the other side in the first direction 110 of the first portion 51 and in which an opening portion 57 opening at the upper side of the first electrically-conductive layer 40 is formed. That is, the second portion 52b and the second portion 52c can be provided so as to interpose a plurality of first portions 51 and opening portions 56 therebetween in the first direction 110.

The second portion 52a and the second portion 52b may also be regions where the second electrically-conductive layer 60 and a first lead wiring 70, which will be described later, are formed. Also, the second portion 52c may also be a region where a second lead wiring 76, which will be described later, is formed. Also, the second portion 52a may also be a portion having a larger area than that of the second portion 52b.

Also, although it is not shown in the drawing, the opening portion 57 may also be formed in the second portion 52b. In this case, the second electrically-conductive layer 60 and the first lead wiring may also be formed in the second portion 52c, and the second lead wiring 76 may also be formed in the second portion 52b.

As shown in FIGS. 2A and 2C, the second portion 52c may also have the opening portion 57 opening at the upper side of the first electrically-conductive layer 40. The opening portion 57 is an opening portion for forming an electric connection portion with the first electrically-conductive layer 40 and may be a so-called contact hole. The shape of the opening portion 57 is not particularly limited as long as electric connection with the first electrically-conductive layer 40 is made. Also, although it is not shown in the drawing, the opening portion 57 may also be formed in the first portion 51 or may also be formed between the first portion 51 and the second portion 52.

Also, although it is not shown in the drawing, a piezoelectric body layer may also be formed which is composed from a surface in which a height from the first face 11 is lower than the face 53 of the first portion 51 in the immovable region 16 between a plurality of first portions 51, and the first portion 51 may also be continuously formed in the second direction 120.

The piezoelectric body layer 50 is composed of a polycrystalline body having a piezoelectric property and can be deformed by voltage which is applied to the piezoelectric device 100. The structure and the material of the piezoelectric body layer 50 are not particularly limited, but it is acceptable if it has a piezoelectric property. The piezoelectric body layer 50 may be formed of a known piezoelectric material and, for example, lead zirconate titanate ($Pb(Zr,Ti)O_3$), bismuth sodium titanate (($Bi,Na)TiO_3$), or the like may also be used.

The second electrically-conductive layer 60 is formed so as to overlap with at least a portion of the first electrically-conductive layer 40 in the movable region 15 when viewed from the direction perpendicular to the first face 11 and cover at least a portion of the first portion 51 of the piezoelectric body layer 50, as shown in FIG. 2A. Also, as shown in FIG. 2B, the second electrically-conductive layer 60 is formed so as to continuously cover the first portions 51 of a plurality of piezoelectric body layers 50 in the second direction 120. Therefore, as shown in FIG. 2B, the second electrically-conductive layer 60 may be formed also in the opening portion 56 (the immovable region 16) provided between adjacent first portions 51. Here, as shown in FIGS. 2A to 2C, a portion extending along the second direction so as to overlap with at least a portion of the first electrically-conductive layer when viewed from the direction perpendicular to the first face 11 and continuously cover a plurality of first portions is set as a third portion 61. As shown in FIGS. 2A and 2C, the third portion 61 may also be provided so as to extend in the second direction 120 on the second portion 52b.

Also, the second electrically-conductive layer 60 may be continuously formed over the second portion 52a of the piezoelectric body layer 50, as shown in FIGS. 2A and 2B. The second electrically-conductive layer may also be provided so as to extend, for example, in the first direction 110 on the second portion 52a. Here, a portion which is electrically connected to the third portion 61, is formed over the second portion 52a of the piezoelectric body layer 50, and extends in the first direction 110 is set as a fourth portion 62.

From the above, the second electrically-conductive layer 60 may have an L-shape composed of the third portion 61 which extends in the second direction 120 and the fourth portion 62 which extends in the first direction 110. Also, although it is not shown in the drawing, the fourth portion 62 may also extend in the second direction 120. Also, although it is not shown in the drawing, the second electrically-conductive layer 60 may also be electrically connected to the first lead wiring 70, which will be described later, without extending in the first direction 110 in the second portion 52a.

As shown in FIGS. 2A and 2C, the first portion 51 which is sandwiched between the first electrically-conductive layer 40 and the second electrically-conductive layer 60 is set as a driving region 55 (a hatched line portion in FIG. 2A). At this time, the shape of the second electrically-conductive layer 60 is not particularly limited as long as it is possible to form a driving region 55 in each of a plurality of movable regions 15. As shown in FIG. 2C, both end portions in the first direction 110 of the third portion 61 may be respectively located on the first portion 51 and the second portion 52 of the piezoelectric body layer 50. As shown in FIG. 2C, an end portion on one side in the first direction 110 of the third portion 61 may define an end portion on one side in the first direction 110 of the driving region 55. Here, an end portion on the other side in the first direction 110 of the driving region 55 may be defined by an end portion of the first electrically-conductive layer 40.

The structure and the material of the second electrically-conductive layer 60 are not particularly limited. For example, the second electrically-conductive layer 60 may be formed in a single layer. Or, the second electrically-conductive layer 60 may also be formed by a laminated body of a plurality of films. The second electrically-conductive layer 60 is composed of a layer having conductivity and constitutes an upper electrode in the piezoelectric device 100. The second electrically-conductive layer 60 may also be, for example, a metal layer including platinum (Pt), iridium (Ir), gold (Au), or the like.

The first lead wiring 70 is electrically connected to the second electrically-conductive layer 60 in the second portions 52a and 52b of the piezoelectric body layer 50, as shown in FIGS. 2A to 2C. The first lead wiring 70 may be a wiring layer formed over the second electrically-conductive layer 60. Also, as shown in FIG. 2A, the first lead wiring 70 may have a fifth portion 71 extending in the first direction 110 on the second portion 52a. Also, the first lead wiring 70 may also have a sixth portion 72, which is electrically connected to the fifth portion 71, is formed over the third portion 61 on the second portion 52b, and extends in the second direction 120. The sixth portion 72 may be formed so as to be disposed adjacent to a plurality of driving regions 55 in the first direction 110. Here, the fifth portion 71 may be a wiring layer having a larger wiring width than the sixth portion 72. Also, as shown in FIG. 2A, the fifth portion 71 may also be smaller in wiring width than the fourth portion 62 of the second electrically-conductive layer 60 in the second portion 52a, and although it is not shown in the drawing, the fifth portion may also be larger in wiring width than the fourth portion 62.

Here, the first lead wiring 70 (the fifth portion 71) is intended to have a flow of electric current which is larger compared to the second lead wiring, which will be described later, and is formed so as to have a larger area than that of the second lead wiring 76. That is, the larger the surface area (shape) of the first lead wiring 70, the more the lead wiring is suitable as a lead wiring of high capacity which creates a large electric current flow. Therefore, as shown in FIG. 2A, the fifth portion 71 may also be formed so as to cover the second portion 52a of the piezoelectric body layer 50 as widely as possible.

Also, the fifth portion 71 is a portion which is electrically connected to a driving circuit 210, shown in FIG. 1, by wire bonding, for example. Therefore, by forming the fifth portion 71 so as to have a larger area, it is possible to more conveniently connect more terminals to the first lead wiring 70. Also, accordingly, it is possible to create a larger electric current flow through the first lead wiring 70.

The structure and the material of the first lead wiring 70 are not particularly limited. For example, the first lead wiring 70 may be formed by a single-layered electrically-conductive layer or may also be formed of a laminated body of a plurality of electrically-conductive layers. The first lead wiring may also be formed of the same material as the second electrically-conductive layer 60 or may also be formed of an electrical conducting material having a lower resistance value and better conductivity than the second electrically-conductive layer 60. The first lead wiring 70 may also be a laminated body which includes, for example, nickel/chromium alloy (NiCr), gold (Au), and the like.

As described above, by providing the sixth portion 72 formed of a material having higher conductivity than the second electrically-conductive layer 60, it is possible to supply electrical power to a plurality of driving regions 55 without generating a drop in voltage. That is, by supplying electrical energy from the fifth portion 71 to the second electrically-conductive layer 60 of the driving region 55, which is in a position distant from the fifth portion 71, through the sixth portion 72, it is possible to reduce a drop in voltage due to energy loss in a wiring.

The second lead wiring 76 is formed so as to be electrically connected at least to the first electrically-conductive layer 40 in the opening portion 57, as shown in FIGS. 2A and 2C. The shape of the second lead wiring 76 is not particularly limited as long as the wiring is electrically connected to the first electrically-conductive layer 40, but the second lead wiring may extend in a desired direction. For example, as shown in FIG. 2A, the second lead wiring may also be formed so as to extend in the first direction 110.

Also, as shown in FIG. 2C, when forming the second electrically-conductive layer 60, the second lead wiring 76 may also be formed from a foundation layer 76a which is an electrically-conductive film formed in the opening portion 57, and a wiring layer 76b formed so as to be electrically connected to the foundation layer 76a. In the case of forming the second lead wiring 76, by providing the foundation layer 76a, the foundation layer 76a serves as a protective film for the first electrically-conductive layer 40 in a manufacturing process, thereby being able to reduce process damage to the first electrically-conductive layer 40, whereby the actuator 200 having high reliability can be formed.

The structure and the material of the second lead wiring 76 are not particularly limited. For example, the second lead wiring 76 may be formed by a single-layered electrically-conductive layer or may also be formed of a laminated body of a plurality of electrically-conductive layers. The second lead wiring may also be formed of the same material as the first lead wiring 70. Also, the second lead wiring may be formed of the same material as the first electrically-conductive layer 40 or may also be formed of an electrical conducting material having a lower resistance value and better conductivity than the first electrically-conductive layer 40.

As described above, the piezoelectric device 100 is electrically connected to the driving circuit 210 (IC) shown in FIG. 1 by the first lead wiring 70 and the second lead wiring 76.

A protective film 80 is formed so as to cover a portion of the first lead wiring 70, as shown in FIGS. 2A to 2C. The protective film may also be formed so as to cover an end portion of the first lead wiring 70 formed over the second electrically-conductive layer 60. Also, the protective film 80 may also be formed so as to cover an end portion of the second electrically-conductive layer 60. Also, as shown in FIGS. 2A and 2C, the protective film 80 may cover a portion of the second lead wiring 76. Also, as shown in FIGS. 2A and 2C, the protective film 80 may also be formed so as to overlap with both end portions in the first direction 110 of the driving region 55. A region where the protective film 80 is formed is not particularly limited as long as the protective film 80 does not cover contact regions (not shown) of the first lead wiring 70 and the second lead wiring 76 with the driving circuit 210 and does not cover all of the driving regions 55 of the piezoelectric device 100.

For example, as shown in FIG. 2A, the protective film 80 may be a single film which covers all regions other than the contact regions (not shown) of the first lead wiring 70 (the fifth portion 71 and the sixth portion 72) and the second lead wiring 76 with the driving circuit 210. At this time, an end portion on one side in the first direction 110 of the protective film 80 may be located on the foundation layer 41, as shown in FIG. 2C, may be located on the first face 11 of the vibration plate 10 although it is not shown in the drawing, or may be located on the second portion 52b.

Also, for example, as shown in FIG. 2A, the protective film 80 may have an opening portion 81 which makes a portion of the third portion 61 of the second electrically-conductive layer 60 be opened. The opening portion 81 may be provided such that both end portions in the first direction 110 of a plurality of driving regions 55 continuously overlap with the protective film 80. That is, when a portion of the third portion 61 which is exposed from the protective film 80 through the opening portion 81 is set as a seventh portion 65, as shown in FIG. 2A, both end portions in the first direction 110 of the seventh portion 65 may extend in the second direction 120 and continuously overlap with a plurality of driving regions 55 when viewed from the direction perpendicular to the first face 11. Also, an end portion on one side in the second direction 120 of the opening portion 81 may be located on the second electrically-conductive layer 60 (the fourth portion 62) formed over the second portion 52a, as shown in FIG. 2B, or may also be located on the second electrically-conductive layer 60 formed in the opening portion 56 between the first portion 51 and the second portion 52a although it is not shown in the drawing. Also, although it is not shown in the drawing, the protective film 80 may also be formed above the immovable region 16 and the opening portion 81 may be formed in a plurality. That is, a plurality of opening portions 81 may also be formed.

The protective film 80 is a film which is provided for preventing peeling-off of the second electrically-conductive layer 60, the first lead wiring 70, and the second lead wiring 76, which are formed over the second portion 52 (52a, 52b, and 52c). Therefore, the material of the protective film 80 is not particularly limited as long as it has insulation properties and can prevent peeling-off of the first lead wiring 70.

The protective film 80 may be formed of at least one of an oxide material, a nitride material, a photosensitive resin material, and an organic-inorganic hybrid material. For example, the protective film 80 may also be formed of an oxide material such as aluminum oxide ($Al_2O_3$) or silicon oxide ($SiO_2$). Accordingly, since it is possible to form a protective film having high rigidity compared to a resin film or the like, it is possible to more reliably prevent peeling-off of the first lead wiring 70. Also, the protective film 80 may also be formed of a nitride material such as silicon nitride ($Si_3N_4$) or boron nitride (BN). Accordingly, since it is possible to form a protective film having high rigidity compared to a resin film or the like, it is possible to more reliably prevent peeling-off of the first lead wiring 70. Also, for example, the protective film 80 may also be formed of a photosensitive resin material such as photosensitive polyimide. Accordingly, since it is possible to form a protective film by a photolithographic technique, it is possible to more conveniently form the protective film 80. Also, for example, the protective film 80 may also be formed of an organic-inorganic hybrid material such as silicone resin or benzocyclobutene resin. By using an organic-inorganic hybrid material as the material of the protective film 80, it is possible to form the protective film 80 having flexibility or formability and also having high strength.

The configuration of the actuator 200 having the piezoelectric device 100 can be made by any of the configurations described above.

The liquid droplet ejecting head 300 related to this embodiment may also have the sealing plate 90 which can seal the piezoelectric device 100, as shown in FIG. 1. The sealing plate 90 has a sealing region 91 which can seal the piezoelectric device 100 in a predetermined space. It is acceptable if the sealing region 91 is a space of a size that does not impede deformation movement of the piezoelectric device 100. Also, the sealing plate 90 may also have an opening portion 92. Since the opening portion 92 can communicate with the though-hole 13 and the reservoir 25, liquid such as ink can be supplied to the reservoir 25 and the pressure chamber 21 through the opening portion 92. The structure and the material of the sealing plate 90 are not particularly limited. For example, the sealing plate 90 may be formed, for example, of single-crystal silicon, nickel, stainless, stainless steel, glass ceramics, or the like. Also, the liquid droplet ejecting head 300 may also have the driving circuit 210 above the seal plate 90, as shown in FIG. 1, for example. Also, the liquid droplet ejecting head 300 may also have a casing (not shown) which is composed, for example, of various resin materials and various metal materials and can house the above-described configuration.

By any of the configurations described above, the configuration of the liquid droplet ejecting head 300 related to this embodiment can be made.

The actuator 200 related to this embodiment has the following features, for example.

According to the actuator 200 related to this embodiment, the protective film 80 is formed so as to cover a portion of the first lead wiring 70 formed above the second portion 52 of the piezoelectric body layer 50. Accordingly, it is possible to provide the actuator 200 with improved reliability.

As described above, since the first lead wiring 70 is a lead wiring which is connected to the second electrically-conductive layer 60 that is an upper electrode common to a plurality of driving regions 55, there is a need for a larger current to flow through the first lead wiring compared to the second lead wiring 76, thus the first lead wiring is formed to have a larger area than the second lead wiring 76. However, as regards the second electrically-conductive layer 60 formed below the first lead wiring 70, adhesion with a piezoelectric material constituting the piezoelectric body layer 50 is not as good as another material such as resin. Therefore, there is a possibility that the fifth portion 71 and the sixth portion 72 of the first lead wiring 70 will peel off from the second portions 52a and 52b of the piezoelectric body layer 50. By covering regions other than a contact region of such a first lead wiring 70 with the driving circuit 210 by the protective film 80, it is possible to reduce the possibility that the first lead wiring 70 will peel off.

Also, by forming the protective film 80 so as to cover a portion of the first lead wiring 70, it is possible to prevent process damage to the first lead wiring 70 in a manufacturing process after formation of the protective film 80, thereby improving reliability of the actuator 200 or the liquid droplet ejecting head 300. Details of the manufacturing process will be described later.

Also, since the protective film 80 can protect the second lead wiring 76 and reduce the possibility that the second lead wiring 76 peels off, similarly to the first lead wiring 70, it is possible to further improve reliability of the actuator 200.

Also, the protective film 80 can overlap with both end portions in the first direction 110 of the driving region 55. Accordingly, it is possible to suppress displacement of both end portions where stress easily concentrates due to displacement of the driving region 55 of the piezoelectric body layer 50, thereby preventing generation of cracks or the like in the peripheries of both end portions of the driving region 55. Therefore, it is possible to further improve reliability of the actuator 200.

By the above configuration, according to the actuator 200 related to this embodiment, it is possible to provide the liquid droplet ejecting head 300 provided with the actuator 200 having high reliability.

2. Method of Manufacturing the Actuator and the Liquid Droplet Ejecting Head

Hereinafter, a method of manufacturing the actuator 200 and the liquid droplet ejecting head 300, which is related to this embodiment, will be described with reference to the drawings.

FIGS. 3A to 10C are cross-sectional views schematically showing the method of manufacturing the actuator 200 and the liquid droplet ejecting head 300, which is related to this embodiment.

As shown in FIGS. 3A to 10C, the method of manufacturing the liquid droplet ejecting head related to this embodiment includes a process for preparing a substrate 1 having the first face 11, a process for forming a plurality of first electrically-conductive layers 40 provided so as to extend in the first direction 110 on the first face 11 and to be disposed adjacent to each other in the second direction 120 intersecting the first direction 110, a process for forming the piezoelectric body layer 50 having the first portion 51 formed so as to cover at least a portion of each of a plurality of first electrically-conductive layers 40, and the second portion 52 other than the first portion 51, a process for forming the second electrically-conductive layer 60 having the third portion 61 which extends along the second direction 120 so as to overlap with at least a portion of each of the first electrically-conductive layers 40 when viewed from the direction perpendicular to the first face 11 and continuously cover a plurality of first portions 51, and the fourth portion 62 which is electrically connected to the third portion 61, is formed over the second portion 52 of the piezoelectric body layer 50, and extends in the first direction 110, a process for forming the first lead wiring 70 having the fifth portion 71 which is formed over the fourth portion 62 of the second electrically-conductive layer 60 and extends in the first direction 110, and a process for forming the protective film 80 formed so as to cover at least a portion of the first lead wiring 70.

The method of manufacturing the liquid droplet ejecting head related to this embodiment varies according to the case of using single-crystal silicon or the like as a material which is used for forming the flow path forming plate 20 and the nozzle plate 30 and the case of using stainless steel or the like. In the following, the method of manufacturing the liquid droplet ejecting head in the case of using single-crystal silicon is described as one example. The method of manufacturing the liquid droplet ejecting head related to this embodiment is not particularly limited to the following manufacturing method, but in the case of using nickel, stainless steel, or the like as a material, a process such as a known electroforming method may be included.

Also, the sequence of each process is not limited to a manufacturing method described below. For example, after the pressure chamber 21 and the like is formed in the flow path forming plate 20, the piezoelectric device 100 may be formed, or, after the piezoelectric device 100 is formed and then sealed by the sealing plate 90, the pressure chamber 21 and the like may be formed in the flow path forming plate 20.

Figure 3A:
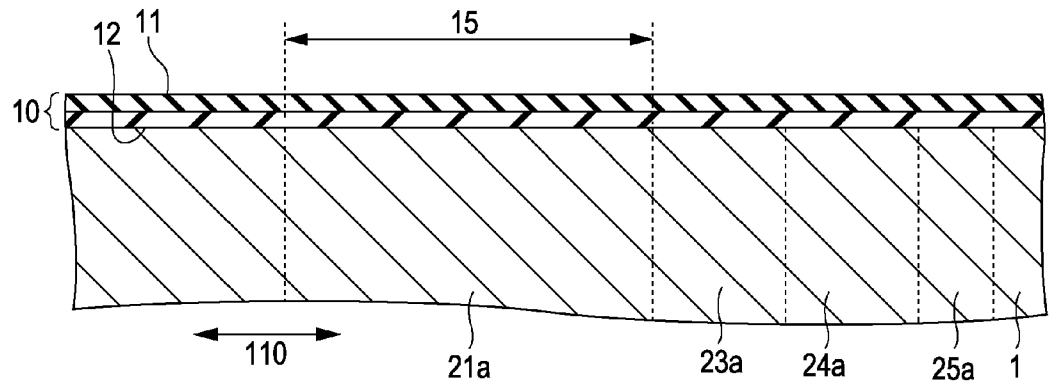
FIGS. 3A to 3C are cross-sectional views schematically showing a method of manufacturing the liquid droplet ejecting head related to the embodiment.

First, as shown in FIG. 3A, the vibration plate 10 is prepared on the prepared substrate 1 composed of single-crystal silicon. As shown in FIG. 3A, in a manufacturing process which will be described later, among the substrate 1, a region where the pressure chamber 21 is formed is set as a region 21a; a region where the supply path 23 is formed is set as a region 23a; a region where the communication path 24 is formed is set as a region 24a; and a region where the reservoir 25 is formed is set as a region 25a. Also, as shown in FIG. 3C, a region where the wall portion 22 is formed is set as a region 22a.

The vibration plate 10 may be formed by a known film-formation technology. As shown in FIG. 3A, for example, the vibration plate 10 may also be formed by forming an elastic layer 10a constituting an elastic plate by a sputtering method or the like and then forming an insulating layer 10b on the elastic layer 10a by a sputtering method or the like. For example, as for the elastic layer 10a, zirconium oxide may be used, and as for the insulating layer 10b, silicon oxide may be used. Here, on the first face 11, a region overlapped with the region 21a is set as the movable region 15. In addition, a detailed explanation of the vibration plate 10 is omitted because the explanation described above can be applied.

Figure 3B:
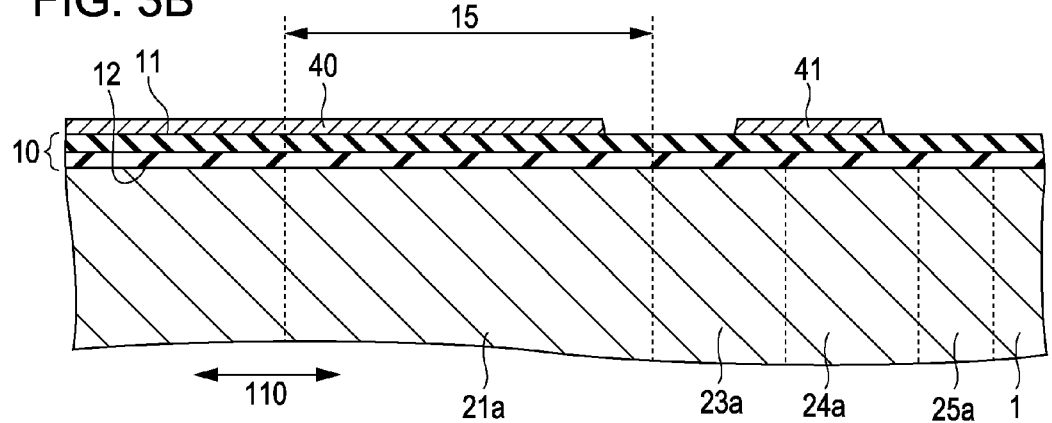

Next, as shown in FIG. 3B, the first electrically-conductive layer 40 is formed over the first face 11 of the vibration plate 10. Here, the first electrically-conductive layer 40 is patterned into a desired shape so as to extend in the first direction 110 in the movable region 15. The first electrically-conductive layer 40 may be formed by a known film-formation technology. The first electrically-conductive layer 40 may also be formed by forming an electrically-conductive layer (not shown) by depositing, for example, platinum, iridium, or the like by a sputtering method or the like, and then etching the electrically-conductive layer into a predetermined shape. In addition, a detailed explanation of the first electrically-conductive layer 40 is omitted because the explanation described above can be applied.

Figure 3C:
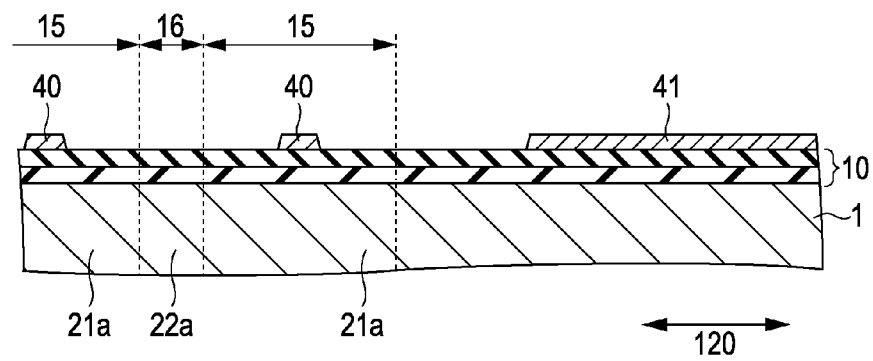

Here, as shown in FIG. 3C, after the electrically-conductive layer is formed over the entire surface of the first face 11, when patterning the first electrically-conductive layer 40, the foundation layer 41 which is composed of an electrically-conductive layer may be formed avoiding at least the movable region 15 on the first face 11. The foundation layer 41 is an electrically-conductive layer electrically insulated from the first electrically-conductive layer 40. Accordingly, since a growth interface of the piezoelectric body layer 50, which will be described later, can be made to be an interface which is composed of an electrically-conductive layer, it is possible to form the piezoelectric body layer 50 with crystal growth controlled.

Figure 4A:
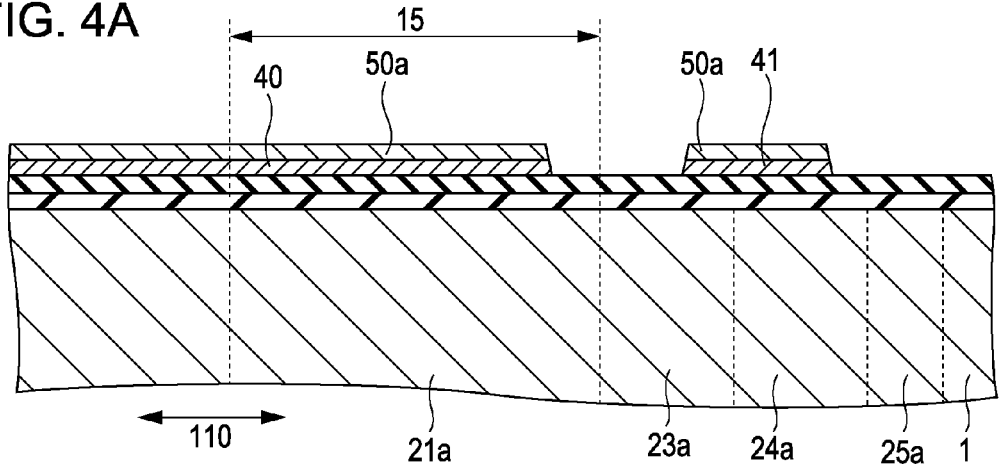
FIGS. 4A to 4C are cross-sectional views schematically showing the method of manufacturing the liquid droplet ejecting head related to the embodiment.

Also, as shown in FIG. 4A, it is also acceptable that before the electrically-conductive layer for forming the first electrically-conductive layer 40 is patterned by etching, an etching protection film 50a is formed on the electrically-conductive layer and the etching of the first electrically-conductive layer 40 is then performed. The etching protection film 50a may be a piezoelectric body layer formed of the same piezoelectric material as the piezoelectric body layer 50, which will be described later. The etching protection film 50a may be formed at least at a region where the first electrically-conductive layer 40 which is patterned into a desired shape is formed. Accordingly, in an etching process for patterning the first electrically-conductive layer 40, the surface of the first electrically-conductive layer 40 can be protected from damage due to an etchant which is used.

Figure 4B:
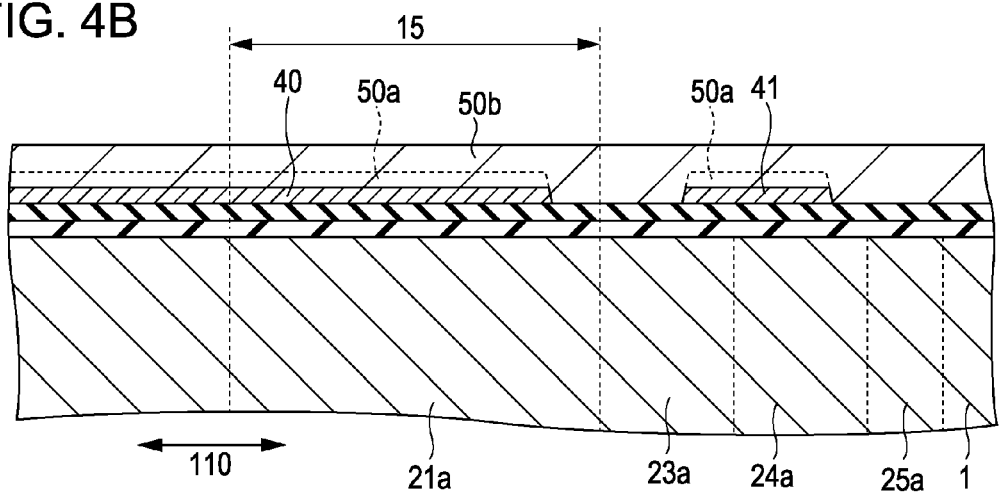

Next, as shown in FIG. 4B, the piezoelectric body layer 50b is formed so as to cover the first electrically-conductive layer 40. The piezoelectric body layer 50 is formed by patterning the piezoelectric body layer 50b. Details will be described later. The piezoelectric body layer 50b may be formed by a known film-formation technology. The piezoelectric body layer 50b may also be formed, for example, by applying a precursor, which is a known piezoelectric material, on the first face 11 and then performing a heating treatment. As a precursor which is used, provided that it generates a piezoelectric property by being subjected to a polarization treatment after firing by a heating treatment, it is not particularly limited, but, for example, a precursor such as lead zirconate titanate may be used. In addition, in a case where the etching protection film 50a is formed, since the etching protection film 50a is formed of the same piezoelectric material as the piezoelectric body layer 50b (the piezoelectric body layer 50), the etching protection film 50a can be integrated with the piezoelectric body layer 50b after firing.

Figure 4C:
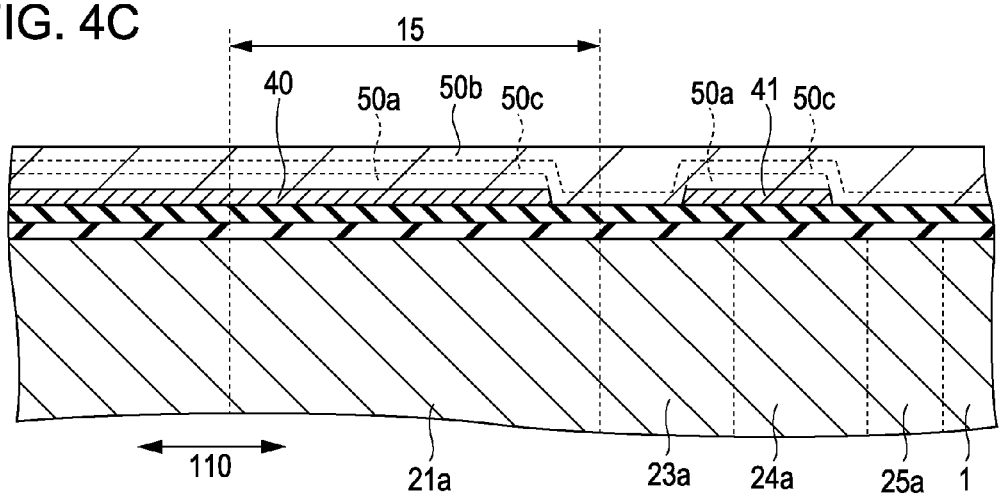

Here, for example, in a case where the piezoelectric body layer 50b (the piezoelectric body layer 50) is formed of lead zirconate titanate, as shown in FIG. 4C, after an intermediate titanium layer 50c which is composed of titanium is formed over the entire surface on the first face 11, a precursor which is a piezoelectric material may also be applied. Accordingly, when performing crystal growth of the piezoelectric body layer 50b by a heating treatment of the precursor, it is possible to unify an interface, which makes crystal growth of the precursor occur, by the intermediate titanium layer 50c. In other words, it is possible to eliminate the piezoelectric body layer 50b which performs crystal growth on the vibration plate 10. Due to this, controllability of crystal growth of the piezoelectric body layer 50b can be increased, so that the piezoelectric body layer 50b can become a piezoelectric body crystal having higher orientation. In addition, the intermediate titanium layer 50c can be incorporated into a crystal of the piezoelectric body layer 50b at the time of a heating treatment.

Figure 5A:
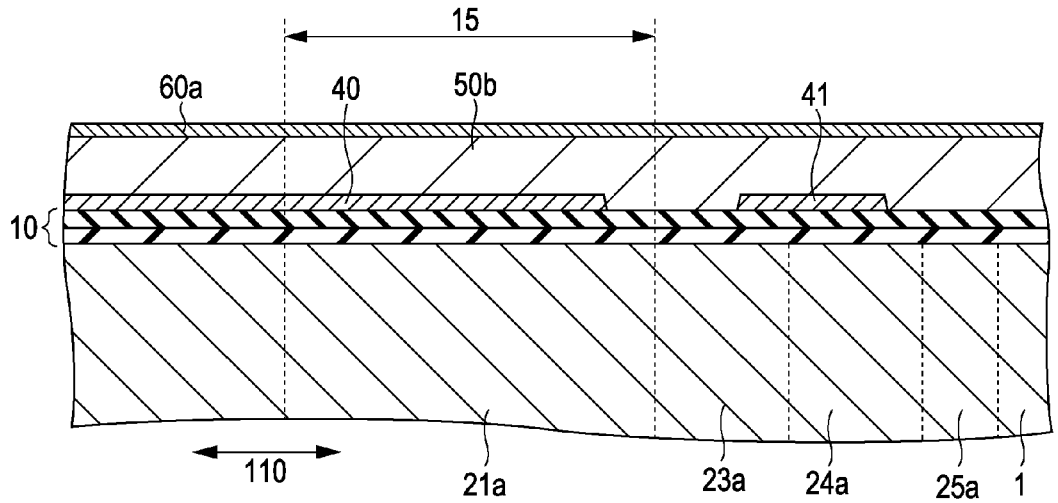
FIGS. 5A to 5C are cross-sectional views schematically showing the method of manufacturing the liquid droplet ejecting head related to the embodiment.

Next, as shown in FIG. 5A, before the piezoelectric body layer 50b is patterned into a desired shape by etching, a mask layer 60a having conductivity may be formed so as to cover the piezoelectric body layer 50b. The mask layer 60a is a metal layer formed of the same material as the second electrically-conductive layer 60 which will be described later.

Figure 5B:
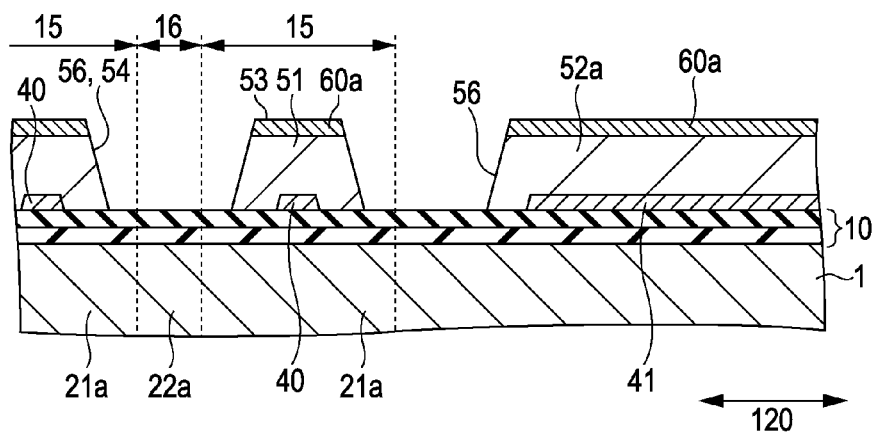

As shown in FIG. 5B, after forming the mask layer 60a, the piezoelectric body layer 50b is patterned by etching, whereby the piezoelectric body layer 50 is patterned into a desired shape. Here, due to formation of the mask layer 60a, since the mask layer 60a acts as a hard mask in an etching process, it is possible to easily form the tapered side surfaces 54 at the piezoelectric body layer 50, as shown in FIG. 5B. As shown in FIG. 5B, by forming the opening portion 56 when patterning the piezoelectric body layer 50, the first portion 51 and the second portion 52 can be formed at the piezoelectric body layer 50. Although it is not shown in the drawing, a groove portion which extends in the first direction 110 and divides the respective first portions 51 may also be formed without forming the opening portion 56.

Figure 5C:
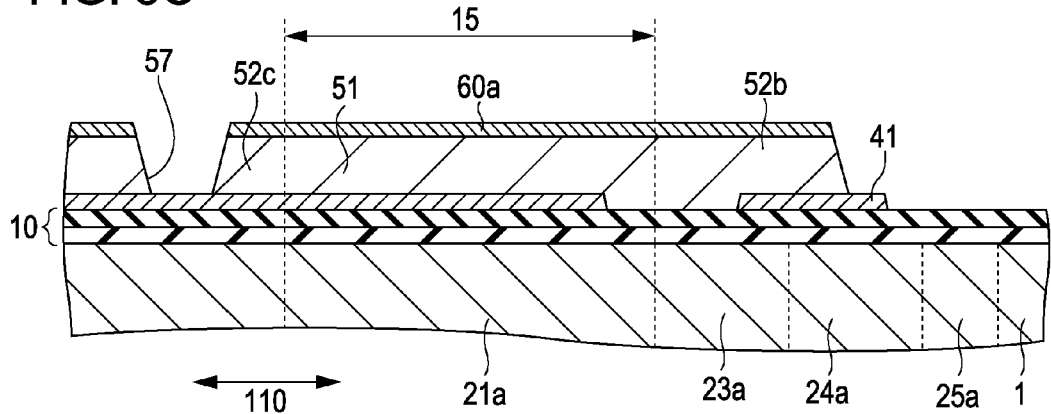

As shown in FIG. 5C, when etching the piezoelectric body layer 50, at the same time, the opening portion 57 which exposes the first electrically-conductive layer 40 is formed above the first electrically-conductive layer 40. The opening portion 57 may also be formed above the first electrically-conductive layer 40 extending outside the movable region 15, for example.

In addition, detailed explanation of the first portion 51 and the second portion 52 of the piezoelectric body layer 50 is omitted because the explanation described above can be applied.

Figure 6A:
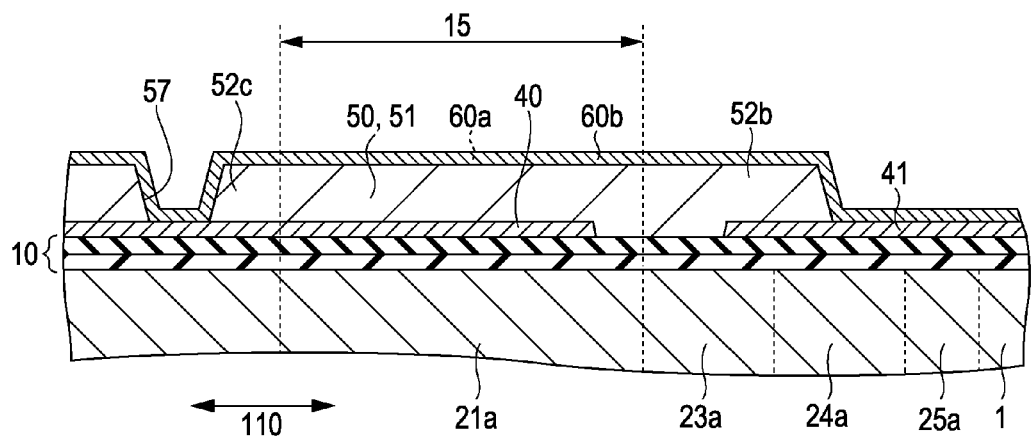
FIGS. 6A and 6B are cross-sectional views schematically showing the method of manufacturing the liquid droplet ejecting head related to the embodiment.
Figure 6B:
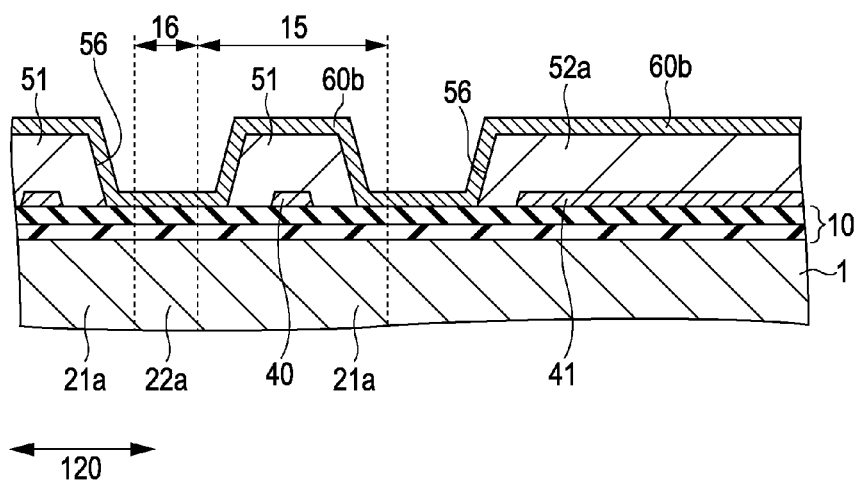

As shown in FIG. 6A, an electrically-conductive layer 60b is formed so as to cover the piezoelectric body layer 50 and the opening portion 57. Here, the electrically-conductive layer may be formed so as to continuously cover the first portion 51, the second portion 52, and the opening portion 56, as shown in FIG. 6B. The electrically-conductive layer 60b is formed of the same material as the second electrically-conductive layer 60. The electrically-conductive layer 60b may be formed by a known film-formation technology. The electrically-conductive layer 60b may also be formed by depositing, for example, platinum, iridium, or the like by a sputtering method. In a case where the mask layer 60a has been formed, since the mask layer 60a is formed using the same material as the second electrically-conductive layer 60, the mask layer 60a can be integrated with the electrically-conductive layer 60b.

Figure 7A:
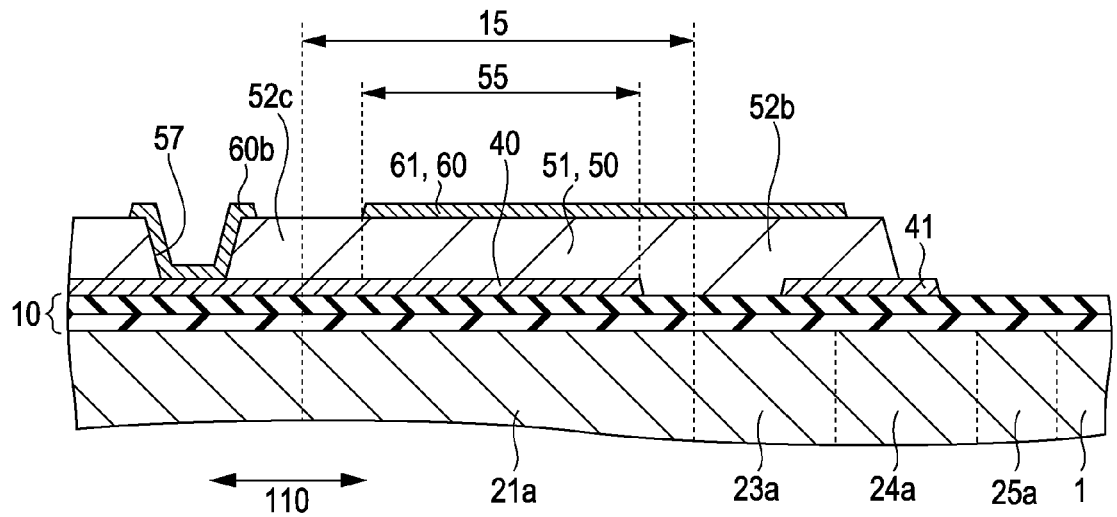
FIGS. 7A and 7B are cross-sectional views schematically showing the method of manufacturing the liquid droplet ejecting head related to the embodiment.
Figure 7B:
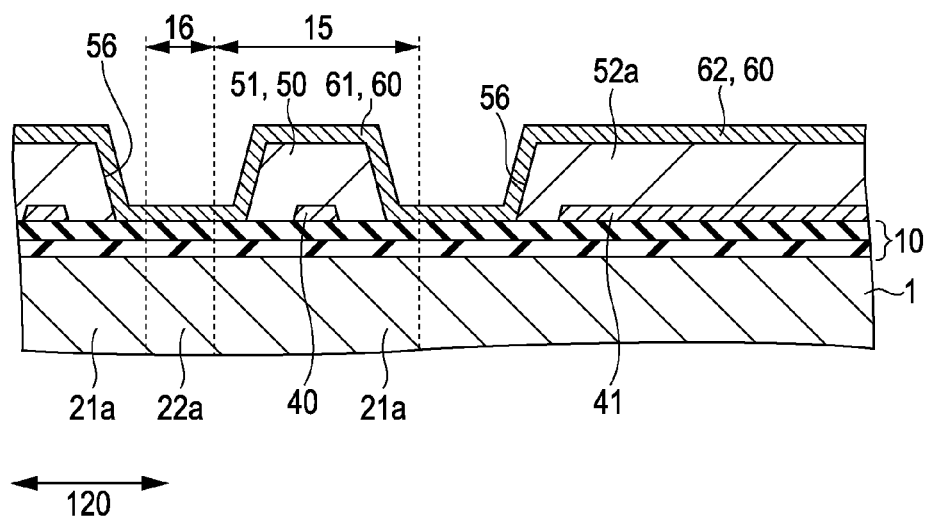

Next, as shown in FIGS. 7A and 7B, the electrically-conductive layer 60b is patterned into a desired shape by etching, so that the second electrically-conductive layer 60 (the third portion 61 and the fourth portion 62) is formed. Here, as shown in FIG. 7A, the driving region 55 sandwiched between the first electrically-conductive layer 40 and the second electrically-conductive layer 60 in the first portion 51 of the piezoelectric body layer 50 can be defined. In addition, detailed explanation of the second electrically-conductive layer 60 is omitted because the explanation described above can be applied.

Also, in a process for patterning the second electrically-conductive layer 60, the electrically-conductive layer 60b may be patterned so as to cover at least the opening portion 57, as shown in FIG. 7A. That is, the electrically-conductive layer 60b formed above the opening portion 57 does not need to be removed. For example, in a case where a resist film is formed by performing an exposure treatment and a development treatment after application of a resist and etching is then performed with the resist film as a mask, an organic alkaline developer, organic peeling liquid, cleaning liquid, or the like is used. Therefore, by not removing the electrically-conductive layer 60b formed above the opening portion 57, it is possible to eliminate a possibility that the surface of the first electrically-conductive layer 40 in the opening portion 57 is overetched. Also, after etching, an exposed portion of the first electrically-conductive layer 40 in the opening portion 57 can be prevented from being subjected to chemical damage due to exposure to organic peeling liquid, cleaning liquid, or the like.

Figure 8A:
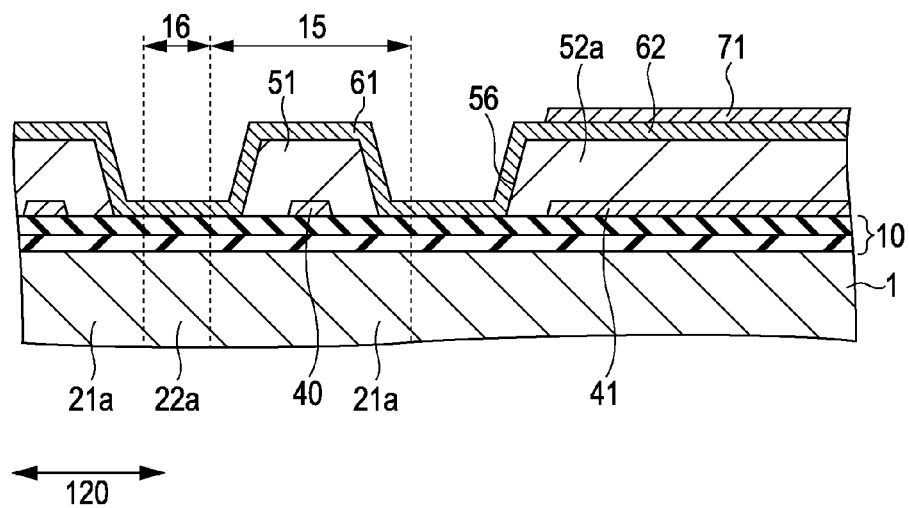
FIGS. 8A and 8B are cross-sectional views schematically showing the method of manufacturing the liquid droplet ejecting head related to the embodiment.
Figure 8B:
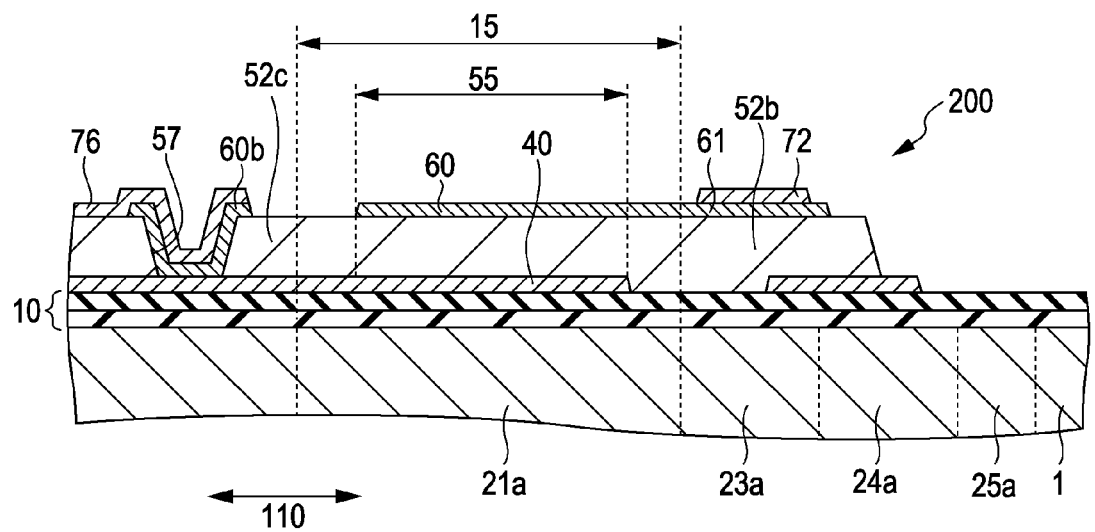

Next, as shown in FIGS. 8A and 8B, the first and second lead wirings 72 and 76 are formed. The first and second lead wirings 72 and 76 may be formed by a known film-formation technology. The first and second lead wirings 72 and 76 may also be formed by forming an electrically-conductive layer (not shown) by a sputtering method or the like by using a material having better conductivity than the second electrically-conductive layer 60 such as gold, nickel/chromium alloy, or the like, for example, and then etching the electrically-conductive layer into a predetermined shape. In addition, detailed explanation of the first and second lead wirings 72 and 76 is omitted because the explanation described above can be applied.

Figure 9A:
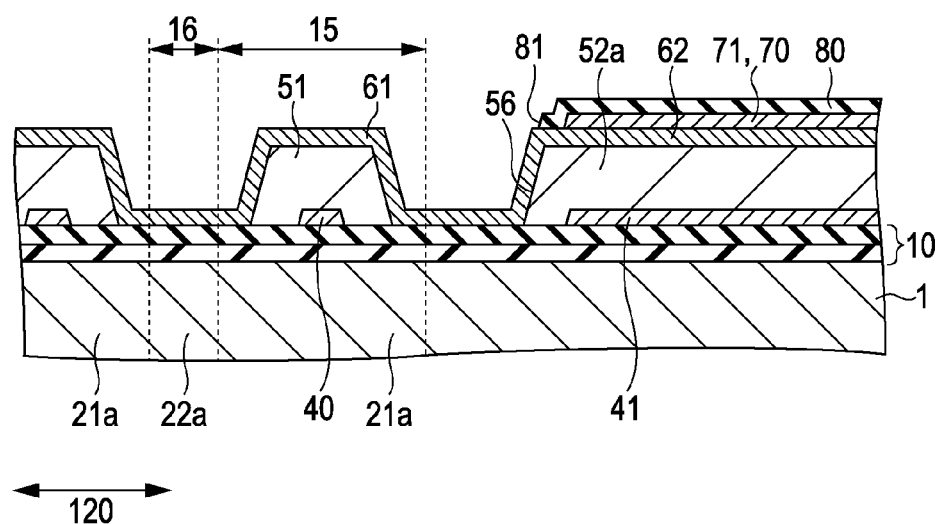
FIGS. 9A and 9B are cross-sectional views schematically showing the method of manufacturing the liquid droplet ejecting head related to the embodiment.
Figure 9B:
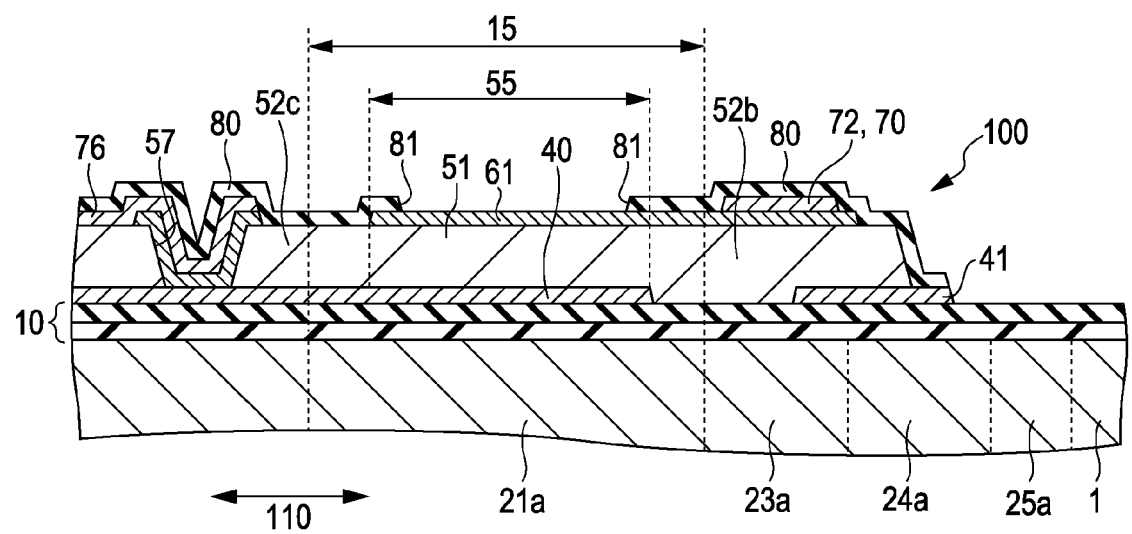

As shown in FIGS. 9A and 9B, the protective film 80 is formed so as to cover at least a portion of the first lead wiring 70. A film-formation method for the protective film 80 is not particularly limited and the protective film may be formed by a known film-formation technology. In a case where the material of the protective film 80 is photosensitive resin, the protective film may also be formed by forming a photosensitive resin film such as polyimide, for example, by a coating method or the like and then patterning the resin film into a desired shape by a photolithographic technique. Also, in a case where the material of the protective film 80 is an oxide material, by forming, for example, a metal film by a known CVD method, a vapor deposition method, or the like, patterning the film into a desired shape, then performing, for example, a thermal oxidation treatment, it is possible to form the protective film 80 composed of an oxide material. In addition, detailed explanation of the protective film 80 is omitted because the explanation described above can be applied.

Figure 10A:
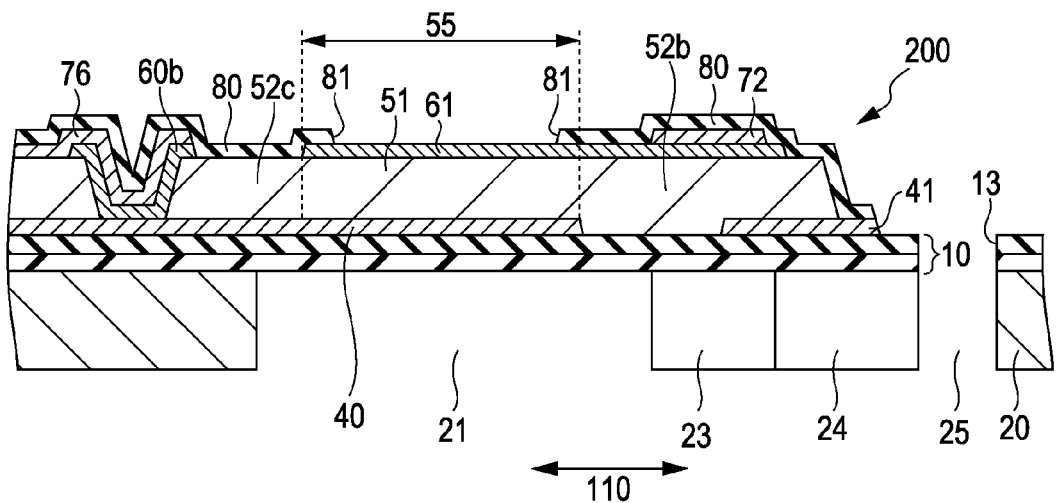
FIGS. 10A and 10B are cross-sectional views schematically showing the method of manufacturing the liquid droplet ejecting head related to the embodiment.
Figure 10B:
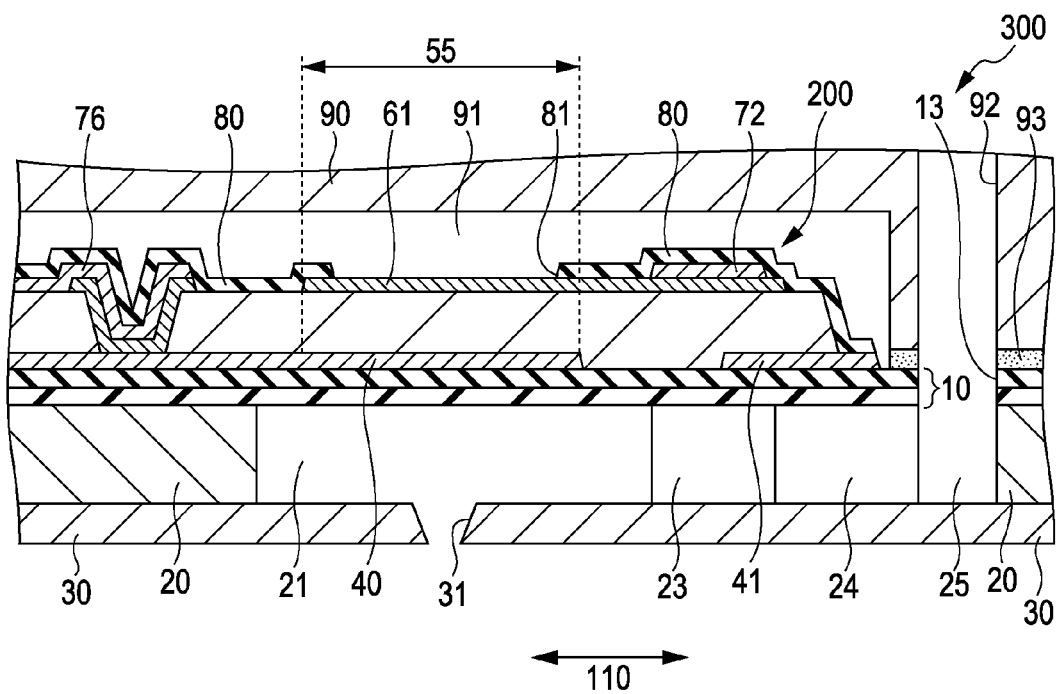

Next, as shown in FIG. 10A, the substrate 1 is thinned to a predetermined thickness and the pressure chamber 21 and the like is then partitioned. For example, with respect to the substrate 1 having the predetermined thickness, by forming a mask (not shown) on the face opposite to the face where the vibration plate 10 is formed, so as to be patterned into a desired shape and then performing an etching treatment, the pressure chamber 21, the wall portion 22, the supply path 23, the communication path 24, and the reservoir 25 are partitioned (not shown). By the above, the flow path forming plate 20 having the pressure chamber 21 can be formed below the vibration plate 10. After formation of the flow path forming plate 20, as shown in FIG. 10B, the nozzle plate 30 having the nozzle orifice 31 is bonded to a predetermined position, for example, by an adhesive agent or the like. Accordingly, the nozzle orifice 31 communicates with the pressure chamber 21.

In this manner, by forming the protective film 80, the first lead wiring 70 covered by the protective film 80 can be protected from process damage in the manufacturing process.

Next, as shown in FIG. 10B, the sealing plate 90 in which the sealing region 91 is formed is mounted on the upper side of the piezoelectric device 100. Here, the piezoelectric device 100 can be sealed within the sealing region 91. The sealing plate 90 may also seal the piezoelectric device 100 by an adhesive agent 93, for example. Here, the opening portion 92 can communicate with the through-hole 13.

By any of the methods described above, the actuator 200 and the liquid droplet ejecting head 300 can be manufactured. In addition, as described above, the method of manufacturing the actuator 200 and the liquid droplet ejecting head 300 is not limited to the methods described above and the flow path forming plate 20 and the nozzle plate 30 may also be integrally formed by using an electroforming method or the like.

The method of manufacturing the actuator and the liquid droplet ejecting head, which is related to this embodiment, has the following features, for example.

According to the method of manufacturing the actuator 200 and the liquid droplet ejecting head 300, which is related to this embodiment, since a process for forming the protective film 80 so as to cover a portion of the first lead wiring 70 is included, it is possible to provide the actuator 200, in which peeling-off of the first lead wiring 70 is prevented and which has high reliability, and the liquid droplet ejecting head 300 having the actuator 200.

Also, by forming the protective film 80 so as to cover a portion of the first lead wiring 70, it is possible to prevent process damage to the first lead wiring 70 in a manufacturing process after formation of the protective film 80, thereby improving reliability of the actuator 200 or the liquid droplet ejecting head 300.

By the above configuration, according to the method of manufacturing the actuator 200 and the liquid droplet ejecting head, which is related to this embodiment, it is possible to provide the actuator 200 having high reliability and the liquid droplet ejecting head 300 having the actuator 200.

3. Liquid Droplet Ejecting Apparatus

Figure 11:
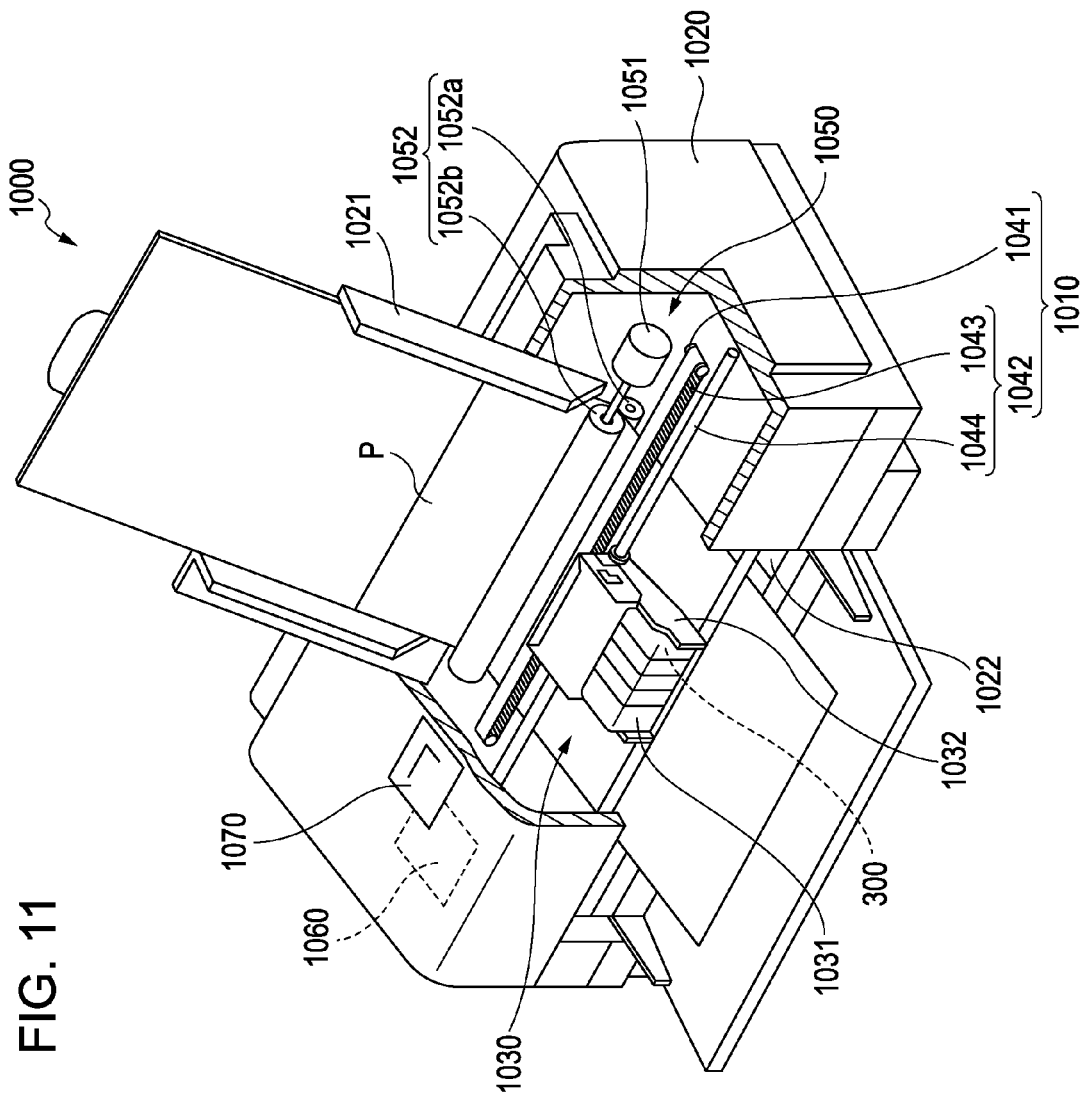
FIG. 11 is a perspective view schematically showing a liquid droplet ejecting apparatus related to the embodiment.

Next, a liquid droplet ejecting apparatus related to this embodiment will be described. The liquid droplet ejecting apparatus related to this embodiment has the liquid droplet ejecting head 300 according to the invention. Here, a case is described where a liquid droplet ejecting apparatus 1000 related to this embodiment is an ink jet printer. FIG. 11 is a perspective view schematically showing the liquid droplet ejecting apparatus 1000 related to this embodiment.

The liquid droplet ejecting apparatus 1000 includes a head unit 1030, a driving section 1010, and a control section 1060. Also, the liquid droplet ejecting apparatus 1000 can include an apparatus main body 1020, a paper feed section 1050, a tray 1021, on which recording paper P is mounted, a discharge opening 1022 which discharges the recording paper P, and an operation panel 1070 disposed on the upper surface of the apparatus main body 1020.

The head unit 1030 has an ink jet type recording head (hereinafter simply referred to also as a "head") which is constituted from, for example, the liquid droplet ejecting head 300 described above. The head unit 1030 further includes an ink cartridge 1031 which supplies ink to the head, and a transport section (a carriage) 1032, on which the head and the ink cartridge 1031 are mounted.

The driving section 1010 can reciprocate the head unit 1030. The driving section 1010 has a carriage motor 1041 which serves as a driving source of the head unit 1030, and a reciprocation mechanism 1042 which receives rotation of the carriage motor 1041, thereby reciprocating the head unit 1030.

The reciprocation mechanism 1042 is provided with a carriage guide shaft 1044 supported at both ends on a frame (not shown), and a timing belt 1043 extending parallel to the carriage guide shaft 1044. The carriage guide shaft 1044 supports the carriage 1032 while allowing the carriage 1032 to freely reciprocate. Further, the carriage 1032 is fixed to a portion of the timing belt 1043. If the timing belt 1043 is driven by operation of the carriage motor 1041, the head unit 1030 reciprocates and is guided by the carriage guide shaft 1044. At the time of this reciprocation, appropriate ink is discharged from the head, whereby printing onto the recording paper P is performed.

The control section 1060 can control the head unit 1030, the driving section 1010, and the paper feed section 1050.

The paper feed section 1050 can send the recording paper P from the tray 1021 to the head unit 1030 side. The paper feed section 1050 is provided with a paper feed motor 1051 which serves as a driving source thereof, and a paper feed roller 1052 which is rotated by an operation of the paper feed motor 1051. The paper feed roller 1052 includes a driven roller 1052*a* and a driving roller 1052*b*, which face up and down with a feed passage of the recording paper P interposed therebetween. The driving roller 1052*b* is connected to the paper feed motor 1051. If the paper feed section 1050 is driven by the control section 1060, the recording paper P is sent so as to pass below the head unit 1030.

The head unit 1030, the driving section 1010, the control section 1060, and the paper feed section 1050 are provided in the inside of the apparatus main body 1020.

The liquid droplet ejecting apparatus 1000 can have the liquid droplet ejecting head 300 according to the invention. The liquid droplet ejecting head 300 according to the invention can have the piezoelectric actuator having high reliability, as described above. Therefore, it is possible to obtain the liquid droplet ejecting apparatus 1000 having high reliability.

In addition, in the example described above, a case has been described where the liquid droplet ejecting apparatus 1000 is an ink jet printer. However, the printer according to the invention can also be used as an industrial liquid droplet ejecting apparatus. As liquid (a liquid material) which is discharged in this case, any of various functional materials adjusted to have appropriate viscosity by a solvent or a dispersion medium, a material including metal flakes or the like, or the like can be used.

As described above, the embodiment of the invention has been described in detail. However, it will be understood by those skilled in the art that many modifications are possible without substantively departing from the new aspects and effects of the invention. Accordingly, all of such modified examples are to be included in the scope of the invention.

What is claimed is:

1. An actuator comprising:
    a substrate having a first face;
    a plurality of first electrically-conductive layers provided so as to extend in a first direction and to be disposed adjacent to each other in a second direction intersecting the first direction in the first face;
    a piezoelectric body layer having a first portion formed so as to cover at least a portion of each of a plurality of the first electrically-conductive layers, and a second portion other than the first portion;
    a second electrically-conductive layer having a third portion which extends along the second direction so as to overlap with at least a portion of each of the first electrically-conductive layers, when viewed from the direction perpendicular to the first face, and continuously cover a plurality of the first portions, and a fourth portion, which is electrically connected to the third portion, is formed over the second portion of the piezoelectric body layer and extends in the first direction;
    a first lead wiring having a fifth portion which is formed over the fourth portion of the second electrically-conductive layer and extends in the first direction; and
    a protective film formed so as to cover at least a portion of the first lead wiring,
    wherein the piezoelectric body layer has a plurality of first opening portions provided so as to extend in the first direction and to be disposed adjacent to each other in the second direction, and
    the first portion of the piezoelectric body layer is a portion sandwiched between the first opening portions.

2. The actuator according to claim 1, wherein
    the third portion of the second electrically-conductive layer further covers a portion of the second portion of the piezoelectric body layer,
    the first lead wiring further has a sixth portion, which is electrically connected to the fifth portion, is formed over the third portion which is over the second portion and extends in the second direction, and
    the sixth portion is also covered by the protective film.

3. The actuator according to claim 1, wherein
    the second portion of the piezoelectric body layer has a second opening portion which exposes a portion of each of the first electrically-conductive layers,
    a second lead wiring which is electrically connected to each of the first electrically-conductive layers in the second opening portion is formed, and
    the protective film further covers a portion of the second lead wiring.

4. The actuator according to claim 1, wherein
    the protective film has a third opening portion which makes a portion of the third portion be opened, and
    when the first portions of the piezoelectric body layer sandwiched between the first electrically-conductive layers and the second electrically-conductive layer are set as driving regions and a portion of the third portion which is exposed from the protective film through the third opening portion is set as a seventh portion, both end portions in the first direction of the seventh portion extend in the second direction and continuously overlap with a plurality of the driving regions when viewed from the direction perpendicular to the first face.

5. The actuator according to claim 1, wherein a foundation layer composed of an electrical-conducting material is formed between the first face of the substrate and the second portion of the piezoelectric body layer.

6. The actuator according to claim 1, wherein material of the protective film is composed of at least one of an oxide material, a nitride material, a photosensitive resin material, and an organic-inorganic hybrid material.

7. A liquid droplet ejecting head comprising: the actuator according to any one of claim 6.

8. A liquid droplet ejecting apparatus comprising: the liquid droplet ejecting head according to claim 7.

9. A liquid droplet ejecting head comprising: the actuator according to any one of claim 5.

10. A liquid droplet ejecting apparatus comprising: the liquid droplet ejecting head according to claim 9.

11. A liquid droplet ejecting head comprising: the actuator according to any one of claim 4.

12. A liquid droplet ejecting apparatus comprising: the liquid droplet ejecting head according to claim 11.

13. A liquid droplet ejecting head comprising: the actuator according to any one of claim 3.

14. A liquid droplet ejecting apparatus comprising: the liquid droplet ejecting head according to claim 13.

15. A liquid droplet ejecting head comprising: the actuator according to any one of claim 2.

16. A liquid droplet ejecting apparatus comprising: the liquid droplet ejecting head according to claim 15.

17. A liquid droplet ejecting head comprising: the actuator according to any one of claim 1.

18. A liquid droplet ejecting apparatus comprising: the liquid droplet ejecting head according to claim 17.

19. A method of manufacturing an actuator, comprising:
preparing a substrate having a first face;
forming a plurality of first electrically-conductive layers provided so as to extend in a first direction and to be disposed adjacent to each other in a second direction intersecting the first direction in the first face;
forming a piezoelectric body layer having a first portion formed so as to cover at least a portion of each of a plurality of the first electrically-conductive layers, and a second portion other than the first portion;
forming a second electrically-conductive layer having a third portion which extends along the second direction so as to overlap with at least a portion of each of the first electrically-conductive layers when viewed from the direction perpendicular to the first face and continuously cover a plurality of the first portions, and a fourth portion, which is electrically connected to the third portion, is formed over the second portion of the piezoelectric body layer and extends in the first direction;
forming a first lead wiring having a fifth portion which is formed over the fourth portion of the second electrically-conductive layer and extends in the first direction; and
forming a protective film formed so as to cover at least a portion of the first lead wiring,
wherein the piezoelectric body layer has a plurality of first opening portions provided so as to extend in the first direction and to be disposed adjacent to each other in the second direction, and
the first portion of the piezoelectric body layer is a portion sandwiched between the first opening portions.

20. A method of manufacturing a liquid droplet ejecting head, comprising:
forming an actuator by the actuator manufacturing method according to claim 9; and
forming a flow path forming plate having pressure chambers which respectively overlap with a plurality of the first electrically-conductive layers in a second face on the opposite side to the first face of the substrate.

* * * * *